US008592813B2

(12) United States Patent
Sugawara

(10) Patent No.: US 8,592,813 B2
(45) Date of Patent: Nov. 26, 2013

(54) SEMICONDUCTOR DEVICE AND STACKED SEMICONDUCTOR APPARATUS

(75) Inventor: Takenori Sugawara, Kanagawa (JP)

(73) Assignee: Sony Corporation, Tokyo (JP)

(*) Notice: Subject to any disclaimer, the term of this patent is extended or adjusted under 35 U.S.C. 154(b) by 164 days.

(21) Appl. No.: 13/067,593

(22) Filed: Jun. 13, 2011

(65) Prior Publication Data
US 2012/0018724 A1 Jan. 26, 2012

(30) Foreign Application Priority Data

Jul. 22, 2010 (JP) ................. 2010-165078

(51) Int. Cl.
H01L 23/58 (2006.01)
(52) U.S. Cl.
USPC ............... 257/48; 257/E27.011; 257/E21.524
(58) Field of Classification Search
USPC .............................. 257/48, E27.011, E21.524
See application file for complete search history.

(56) References Cited

U.S. PATENT DOCUMENTS

| 2003/0008424 | A1* | 1/2003 | Kajiwara et al. | 438/18 |
| 2003/0085461 | A1* | 5/2003 | Sakiyama et al. | 257/700 |
| 2008/0148116 | A1* | 6/2008 | Deng et al. | 714/721 |
| 2010/0253317 | A1* | 10/2010 | Okuno et al. | 323/351 |

FOREIGN PATENT DOCUMENTS

JP 2009-139273 6/2009

* cited by examiner

Primary Examiner — Timor Karimy
(74) Attorney, Agent, or Firm — Rader, Fishman & Grauer PLLC

(57) ABSTRACT

A semiconductor device includes: a through-electrode formed in a perpendicular direction so as to extend therethrough; a series circuit section formed from a plurality of test-ready switches successively connected in series and driven by a driving voltage transmitted to the through-electrode through a predetermined different layer through-electrode of a different semiconductor device stacked on an upper layer side or a lower layer side; and a pair of test terminals connected to end portions of the series circuit section and adapted to be used for measurement of conduction of the series circuit section.

17 Claims, 8 Drawing Sheets

FIG.8

| | TRANSISTOR SERIES CONNECTION METHOD | BOUNDARY SCAN METHOD | DIODE METHOD |
|---|---|---|---|
| PIN NUMBER | 2 TO 4 [PINS] | 4 [PINS] | 10010 [PINS] |
| CIRCUIT AMOUNT | 7k [GATES] | 110k [GATES] | 10k [DIODE] |
| TEST TIME | 9 [CYCLES] | 40k [CYCLES] | 10k [CYCLES] |
| TSV ARRAYS DIFFERENT AMONG DIFFERENT LAYERS | READY | READY | NOT READY |

SEMICONDUCTOR DEVICE AND STACKED SEMICONDUCTOR APPARATUS

BACKGROUND

This technology relates to a semiconductor device, and more particularly to a semiconductor device which has a structure including a through-electrode provided therein and stacked in a stacked semiconductor apparatus and a stacked semiconductor apparatus configured by stacking such semiconductor devices.

As an integrated semiconductor apparatus including a plurality of semiconductor chips, a stacked semiconductor apparatus in which semiconductor chips are stacked is known. In the stacked semiconductor device, the mounting area for the semiconductor chips can be reduced significantly, for example, in comparison with an integrated semiconductor apparatus wherein semiconductor chips are arranged in a plane.

Further, in the stacked semiconductor apparatus, it has been proposed to form a through-electrode called TSV (Through-Silicon Via) in semiconductor chips, and is being developed to achieve practical implementation thereof.

By forming through-electrodes in semiconductor chips, it becomes possible to lay wiring lines between the chips by connections of the through-electrodes to each other in a stacked semiconductor apparatus. This eliminates the necessity for connection by wire bonding.

According to wiring bonding, since a wiring line must be led out from an end portion of a semiconductor chip, the number of connections between semiconductor chips is limited to approximately 100 to 200. In contrast, in the case of through-electrodes, it is possible to form them at distances of, for example, several tens μm in a semiconductor chip. Therefore, it is possible to easily form more than 1,000 through-electrodes in one semiconductor chip. Consequently, also it is possible to increase the number of connections to a different semiconductor chip to 1,000 or more.

In order to manufacture a stacked semiconductor apparatus which includes such through-electrodes as described above, it is necessary to test connections between through-electrodes in regard to whether or not they are good. A boundary scan method is known as one of techniques for testing whether or not a connection between semiconductor chips is good. The boundary scan method is standardized as IEEE Standard 1149.1 Standard Test Access Port and Boundary-Scan Architecture. This boundary scan standard has been standardized by JTAG (Joint Test Action Group).

In a test according to the boundary scan, an internal circuit ready for boundary scan is incorporated in advance in a semiconductor chip which makes an object of the test. The internal circuit is also called boundary scan cell and is provided, for example, corresponding to each of terminals for connecting the semiconductor chip to an external circuit. Then, the boundary scan cell is controlled to input or output a signal from or to the external circuit while such semiconductor chips are connected to each other by a daisy chain thereby to decide whether or not the connections between the semiconductor devices are good.

Also such a related art as described below is known as a connection test between semiconductor chips of a stacked semiconductor apparatus. In particular, a diode element for a conduction check is connected at the cathode thereof to each of an internal terminal, that is, a through-electrode, in each semiconductor chip. Further, an external terminal connected commonly to the anode of the diodes in one semiconductor chip is provided on each of the semiconductor chips of different layers. Further, a terminal for exclusive use for a conduction test is provided for each of wiring lines of the through-electrodes which are connected to each other between the semiconductor chips. Then, a predetermined voltage is applied to a combination of each one of the external terminals and each one of the terminals for exclusive use for a conduction test to select and drive one diode element. The value of current flowing through the diode element driven in this manner is measured to decide the connection state of the through-electrodes corresponding to the diode element (refer to Japanese Patent Laid-Open No. 2009-139273, particularly FIG. 1).

SUMMARY

However, if a connection test by the boundary scan method described above is actually applied to a stacked semiconductor apparatus in which wiring between semiconductor chips is carried out using through-electrodes, then a boundary scan cell is mounted for each of the through-electrodes of the semiconductor chips. Therefore, the number of boundary scan cells to be mounted in each of the semiconductor chips becomes a greater number, for example, exceeding 1,000. A boundary scan cell is formed from such circuits as, for example, a multiplexer, flip-flops and a selector and is formed, where NAND gates are used, from a comparatively great number of logic gates such as, for example, 10 or more. This significantly increases the circuit scale of the semiconductor chips. Further, with the boundary scan, since operation of inputting and outputting data of different bit values while shifting the data is carried out for each through-electrode, also the test time becomes very long, and this increases the cost.

Meanwhile, in the related art which includes a diode element for a conduction test, since only a diode may be added as a circuit to be added for each through-electrode for testing, increase of the circuit scale may be a little. However, with the related art described, it is necessary to provide an external terminal for each of wiring lines of the through-electrodes between semiconductor chips. Accordingly, actually a number of pin terminals corresponding to the number of external terminals which is, for example, 1,000 or more must be provided. Since the region in which pin terminals for a test can be disposed is limited in a stacked semiconductor apparatus, preferably the number of pin terminals is minimized.

Therefore, it is desirable to provide a semiconductor device and a stacked semiconductor apparatus by which suppression of increase of the circuit scale, reduction of the test time, reduction of the number of pin terminals and so forth can be achieved while it is tested whether or not connections between semiconductor chips which include through-electrodes are good.

According to an embodiment, there is provided a semiconductor device including a through-electrode formed in a perpendicular direction so as to extend therethrough, a series circuit section formed from a plurality of test-ready switches successively connected in series and driven by a driving voltage transmitted to the through-electrode through a predetermined different layer through-electrode of a different semiconductor device stacked on an upper layer side or a lower layer side, and a pair of test terminals connected to end portions of the series circuit section and adapted to be used for measurement of conduction of the series circuit section. In the semiconductor device, by applying the driving voltage from the different semiconductor device to the semiconductor device to measure the conduction of the series circuit section, whether the connections between the semiconductor devices of different layers can be tested.

The semiconductor device may be configured such that the test-ready switches are first transistors which are placed into an on state in response to application of a gate voltage, and the first transistors are connected at a gate thereof to the through-electrode. In the semiconductor device, the test-ready switches are formed from transistors.

The semiconductor device may further include a resistor inserted between a gate of each of the first transistors and the ground. In the semiconductor device, in the case where the connection of the through-electrode connected to the gate of the first transistor is not good, the gate potential of the first transistor is fixed to the ground.

Further, the semiconductor device may be configured such that the resistor is a second transistor which is driven so as to generate a predetermined resistance value in response to application of a gate voltage. In the semiconductor device, the transistor is driven to form the resistor.

Further, the semiconductor device may be configured such that the series circuit section includes a plurality of divisional serial circuit sections formed by successively connecting those of the first transistors which do not overlap with each other in series, and the semiconductor device further includes a selection circuit adapted to select one of the divisional series circuit sections as an object of selection, and a driving circuit section adapted to drive the second transistor inserted between the ground and the gate of those of the first transistors which form the divisional series circuit section selected as the object of measurement. In the semiconductor device, the conduction is measured for each selected one of the divisional series circuit sections.

According to a second embodiment, there is provided a semiconductor device including a through-electrode formed in a perpendicular direction so as to extend therethrough, a series circuit section formed from a plurality of test-ready switches successively connected in series and driven by a driving voltage transmitted to the through-electrode through a different layer through-electrode of different semiconductor devices stacked on an upper layer side or a lower layer side, a pair of test terminals connected to end portions of the series circuit section and adapted to be used for measurement of conduction of the series circuit section, and a driving voltage application section adapted to apply, to the through-electrode, a driving voltage for driving a test-ready switch provided in a particular one of the different semiconductor devices. In the semiconductor device, the one semiconductor device has the functions of the series circuit section by which conduction measurement is carried out and the driving voltage application section which applies the driving voltage.

The semiconductor device may be configured such that the test-ready switch is a first transistor which is placed into an on state in response to application of a gate voltage and the first transistor is connected at a gate thereof to the through-electrode, and the driving voltage application section is a third transistor inserted between the through-electrode and a signal line for the driving voltage and adapted to be placed into an on state in response to application of a gate voltage. In the semiconductor device, the test-ready switch and the driving voltage application section are each formed from a transistor.

Further, the semiconductor device may be further include a second transistor inserted between the gate of the first transistor and the ground and driven so as to generate a predetermined resistance value in response to application of a gate voltage. In the semiconductor device, in the case where the connection of the through-electrode connected to the gate of the first transistor is not good, the gate potential of the first transistor is fixed to the ground.

Further, the semiconductor device may be configured such that the second transistor and the third transistor are inserted in parallel between the gate of the first transistor and a terminal to which a control voltage which is changed over between a potential of the driving voltage and a ground potential is inputted. In the semiconductor device, by changing over the control voltage to the terminal, changeover between operation of the second transistor and operation of the third transistor is carried out.

Or, the semiconductor device may be further include a mode changeover transistor inserted between a normal operation-ready circuit section, which functions corresponding to normal operation, and the through-electrode and adapted to be changed over between on and off states in response to application of a gate voltage, the mode changeover transistor being placed into an off state in response to application of a gate voltage which places the third transistor into an on state. In the semiconductor device, by controlling the third transistor to an on state, the signal line between the normal operation-ready circuit section and the through-electrode is blocked simultaneously.

According to a third embodiment, there is provided a stacked semiconductor apparatus including at least a first semiconductor device and a second semiconductor device stacked with each other. The first semiconductor device includes a first through-electrode formed in a perpendicular direction so as to extend therethrough, a series circuit section formed from a plurality of test-ready switches successively connected in series and driven by a driving voltage transmitted to the first through-electrode through a connection of the through-electrodes from the second semiconductor device to the first semiconductor device, and a pair of test terminals connected to end portions of the series circuit section and adapted to be used for measurement of conduction of the series circuit section. The second semiconductor device includes a second through-electrode formed in a perpendicular direction so as to extend therethrough and connected to the first through-electrode through a connection of the through-electrodes from the second semiconductor device to the first semiconductor device, and a driving voltage application section adapted to apply the driving voltage to the second through-electrode. In the stacked semiconductor apparatus, by applying the driving voltage from the second semiconductor device to test the conduction of the series circuit section in the first semiconductor device, whether or not the connections between different layers from the first semiconductor device to the second semiconductor device is tested.

With the semiconductor devices and the stacked semiconductor apparatus, a superior advantage can be achieved that suppression of increase of the circuit scale, reduction of the test time, reduction of the number of pin terminals and so forth can be achieved while it is tested whether or not connections between semiconductor chips which include through-electrodes are good.

The above and other features and advantages of the present technology will become apparent from the following description and the appended claims, taken in conjunction with the accompanying drawings in which like parts or elements denoted by like reference characters.

BRIEF DESCRIPTION OF THE DRAWINGS

FIG. 8 is a view illustrating comparison in number of pin terminals, circuit amount, test time and readiness for through-electrode arrangement different among different layers between the embodiments and related art methods.

DETAILED DESCRIPTION OF THE PREFERRED EMBODIMENTS

In the following, embodiments of the disclosed technology are described. The description is given in the following order.

1. First Embodiment (configuration wherein a test transistor of a chip is driven from a different chip through a through-electrode wiring line)

2. Second Embodiment (configuration wherein a test transistor of a chip is driven from a different chip through a through-electrode wiring line: example of a case in which circuits for a connection test in different chips are common in configuration)

3. Third Embodiment (configuration wherein a test transistor of a chip is driven from a different chip through a through-electrode wiring line: particular example ready for a stacked system semiconductor apparatus)

4. Fourth Embodiment (configuration wherein a test transistor of a chip is driven from a different chip through a through-electrode wiring line: example wherein a series connection of test transistors is divided)

1. First Embodiment

Example of a Basic Configuration for a Connection Test in the Embodiment

In the embodiment of the present technology, the quality of a connection of a through-electrode between semiconductor chips stacked in a stacked semiconductor apparatus is tested. In the following, to test the quality of a connection of a through-electrode between semiconductor chips is referred to also as connection test.

Figure 1:
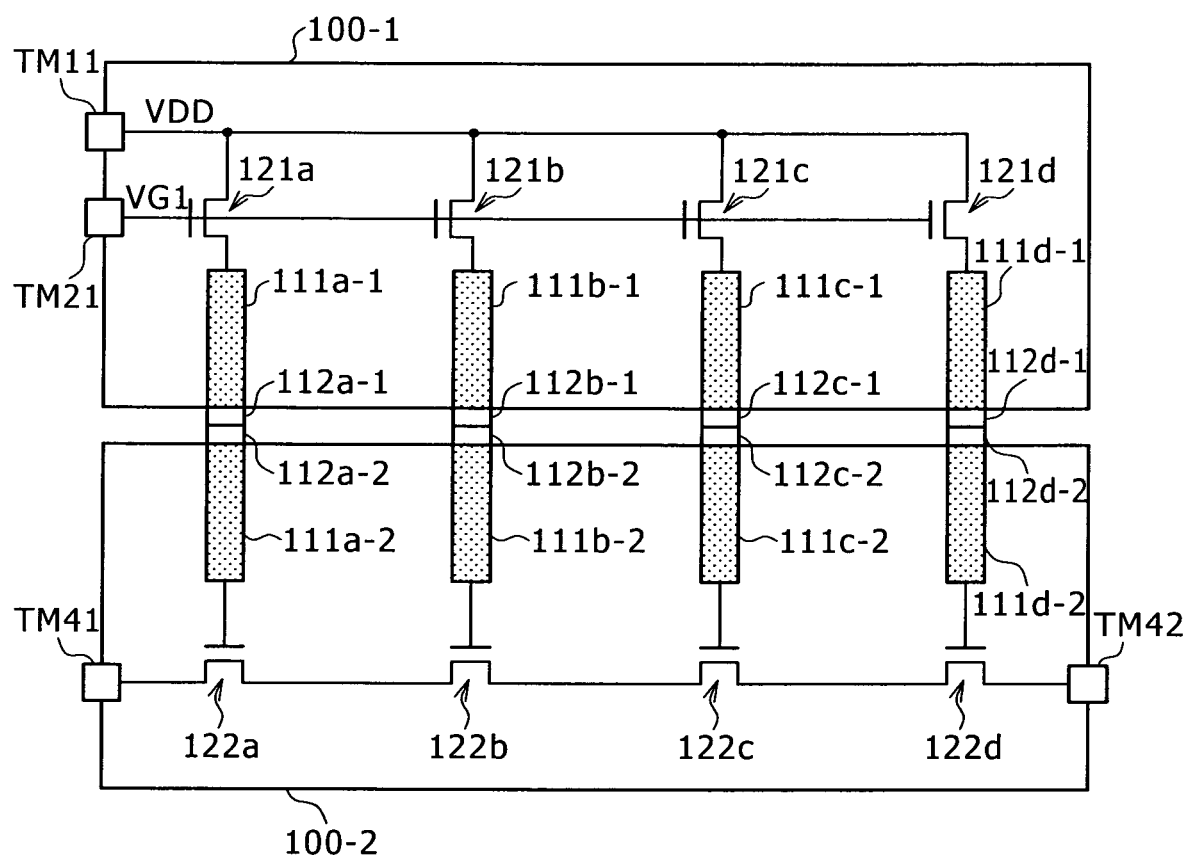
FIG. 1 is a schematic diagrammatic view showing an example of a basic configuration of a chip according to a first embodiment.

FIG. 1 shows an example of a circuit configuration corresponding to a basic concept of a connection test according to the embodiment. Referring to FIG. 1, two chips 100-1 and 100-2 stacked so as to have an upwardly and downwardly placed relationship to each other. Particularly, the chip 100-1 is disposed as an upper layer and the chip 100-2 is disposed as a lower layer.

The chip 100-1 is shown including four through-electrodes 111a-1 to 111d-1. Also the chip 100-2 includes four through-electrodes 111a-2 to 111d-2 corresponding to the through-electrodes 111a-1 to 111d-1, respectively. The through-electrodes 111 (111a-1 to 111d-1 and 111a-2 to 111d-2) are formed so as to extend through the chip 100 in a stacking direction, that is, in a vertical direction, and are generally called also through-silicon vias (TSVs).

It is to be noted that, in FIG. 1, in order to illustrate a relationship between a circuit for testing and the through-electrodes 111 on the chip 100 such that it can be recognized readily, for the convenience of illustration, the through-electrodes 111 are not shown in accordance with an actual state in which they extend through the chip 100. Actually, the through-electrodes 111 are formed such that they extend through the chip 100 in the vertical direction.

A microbump 112 serving as a connection terminal is provided at an end portion of each of the through-electrodes 111. In particular, in FIG. 1, a microbump 112a-1 is provided corresponding to a lower side end portion of the through-electrode 111a-1 on a lower face of the chip 100-1. Similarly, microbumps 112b-1 to 112d-1 are provided corresponding to lower side end portions of the through-electrodes 111b-1 to 111d-1, respectively. Further, on an upper face of the chip 100-2, microbumps 112a-2 to 112d-2 are provided corresponding to upper side end portions of the through-electrodes 111a-2 to 111d-2, respectively.

Between the chip 100-1 and the chip 100-2, connection between the through-electrodes 111-1 and 111-2 is carried out by joining of the microbumps 112-1 and 112-2 opposing to each other. In particular, in the case of FIG. 1, the microbump 112a-1 and the microbump 112a-2 are joined together to connect the through-electrode 111a-1 and the through-electrode 111a-2 to each other. The microbumps 112b-1 to 112d-1 and the microbumps 112b-2 to 112d-2 are connected to each other similarly. Consequently, the through-electrodes 111b-1 to 111d-1 and the through-electrodes 111b-2 to 111d-2 are connected to each other, respectively.

Now, a configuration for a connection test is described. First, the chip 100-1 includes driving transistors 121a to 121d. The driving transistors 121a to 121d drive the corresponding through-electrodes 111a-1 to 111d-1 upon a connection test, respectively.

The driving transistors 121a to 121d are connected at the drain thereof to the through-electrodes 111a-1 to 111d-1, respectively. Meanwhile, the driving transistors 121a to 121d are connected at the source thereof commonly to a power supply voltage VDD supplied from a terminal TM11. The driving transistors 121a to 121d are connected at the gate thereof to a terminal TM21 so that a gate voltage VG1 supplied from the outside is applied commonly to the gate of the driving transistors 121a to 121d. It is to be noted that the power supply voltage VDD is an example of a driving voltage.

On the other chip 100-2, one test transistor 122a to 122d is provided for each of the through-electrodes 111a-2 to 111d-2. The test transistors 122a to 122d have a function of detecting the connection state of the corresponding through-electrodes 111a to 111d, respectively. The test transistors 122a to 122d are connected at the gate thereof to the corresponding through-electrodes 111a-2 to 111d-2, respectively. Further, the test transistors 122a to 122d are successively connected in series as seen in FIG. 1. It is to be noted that the series connection of the test transistors 122 formed in this manner is hereinafter referred to sometimes as transistor series connection. The transistor series circuit is an example of a series circuit section.

The test transistor 122a at one of the opposite ends of the transistor series circuit is connected at the drain or source thereof to a terminal TM41. Meanwhile, the test transistor 122d at the other end of the transistor series circuit is connected at the source or drain thereof to another terminal TM42. It is to be noted that the terminals TM41 and TM42 are test terminals.

Now, operation of the configuration shown in FIG. 1 upon a connection test is described. Upon a connection test, signal lines for conduction measurement led out from a testing apparatus and the terminals TM41 and TM42 of the chip 100-1 are connected to each other. This makes it possible to measure conduction of the transistor series circuit using the testing apparatus.

Then, under the condition described above, the gate voltage VG1 of a predetermined level is applied from the terminal TM21 in a state in which the power supply voltage VDD is applied to the terminal TM11 of the chip 100-1 side. Consequently, in the chip 100-1, the driving transistors 121a to 121d are rendered conducting and consequently apply the power supply voltage VDD to the corresponding through-electrodes 111a-1 to 111d-1, respectively.

Here, it is assumed that the connection, for example, between the microbump 112a-1 and the microbump 112a-2 is good. In this instance, the power supply voltage VDD applied to the through-electrode 111a-1 is transmitted to the through-electrode 111a-2 and applied to the gate of the test transistor 122a. Consequently, the test transistor 122a is placed into an on state. On the other hand, in the case where the connection between the microbump 112a-1 and the microbump 112a-2 is not good, the power supply voltage VDD is not applied to the gate of the test transistor 122a through the through-electrode 111a-2. Therefore, the test transistor 122a is placed into an off state. In this manner, each test transistor 122 is placed into an on state if the joining between the corresponding microbumps 112-1 and 112-2 is good but is placed into an off state if the joining is not good.

Accordingly, the series connection circuit of the test transistors 122a to 122d conducts if all of the connection conditions between the microbumps are good, but does not conduct if at least one of the connection conditions is not good. The testing apparatus measures such a conduction state of the transistor series circuit as just described. It is to be noted that the measurement of the conduction state can be carried out by measuring, for example, an actual resistance value or current value of the transistor series circuit or potentials or the like in the transistor series circuit.

If a measurement result representing that the transistor series circuit conducts is obtained, then it can be determined that the connection of all through-electrodes 111-1 and 111-2 between the chip 100-1 and the chip 100-2 is good. On the other hand, if another test result that the transistor series circuit does not conduct is obtained, then it can be decided that at least a pair of ones of the through-electrodes 111-1 and 111-2 between the chip 100-1 and the chip 100-2 is not good.

In this manner, as a connection test in the present embodiment, the transistors of the chip 100-1 are driven to apply a voltage to the through-electrodes 111. Then, in the chip 100-2, the voltage applied to the through-electrodes is applied to the gate of the test transistors 122 which form the transistor series circuit, and in this state, the conduction is measured. Consequently, a test regarding whether or not the connections of all through-electrodes between the chips is good can be carried out.

It is to be noted that, in the connection test described above, even if, for example, the joining between the microbumps is good, if some place does not exhibit conduction because a through-electrode 111 itself is not good, then the transistor series circuit is not placed into a conductive state. In other words, it can be considered that the present connection test carries out also an inspection regarding whether or not the through-electrodes 111 themselves are good.

Further, according to the description given hereinabove, it is considered that each of the test transistors 122 functions as a switch which exhibits an on state in a state in which a voltage is applied to a corresponding through-electrode 111-2 but exhibits an off state in another state in which no voltage is applied. Each test transistor 122 is an example of a test-ready switch and also an example of a first transistor in the disclosed technology. Meanwhile, each of the driving transistors 121 is an example of a driving voltage application section and also an example of a third transistor in the disclosed technology.

Example of Addition of a Pull-Down Resistor to the Basic Configuration

The configuration described hereinabove with reference to FIG. 1 represents a basic concept ready for a connection test of the embodiment to the end. Therefore, if a connection test is actually carried out using the circuit configuration shown in FIG. 1 as it is, then such a defect as described below occurs.

For example, it is assumed that the connection between the through-electrodes 111a fails because of joining failure between the microbumps 112a-1 and 112a-2 shown in FIG. 1. In this instance, in the circuit shown in FIG. 1, the gate of the test transistor 122a is open and is placed into a floating state in which it is not electrically connected to anything. In this state, the gate potential is insatiable, and depending upon the potential state then, there is the possibility that the test transistor 122a may be placed into an on state. Further, as a state in which the connection between the through-electrodes 111a is not good although, for example, full disconnection is not reached, a high resistance value is sometimes measured. Also in such an instance, the potential is transmitted through the wiring line of the through-electrodes 111a. Therefore, the test transistor 122a is placed into an on state.

If the circuit form wherein the electric connection between through-electrodes 111 fails to cause the gate of a corresponding test transistor 122 to be placed into an open state in this manner remains as it is, then there is the possibility that, although the circuit form is defective, a wrong test result that the connection is good may be obtained.

Figure 2:
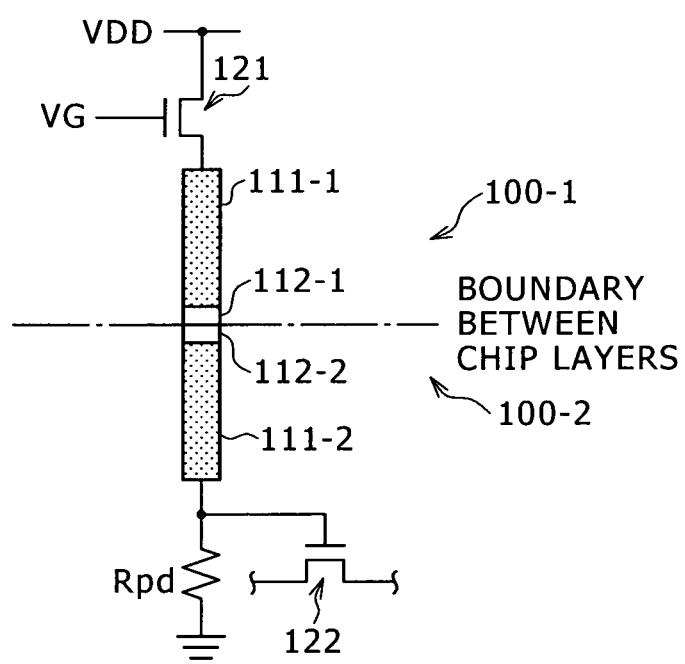
FIG. 2 is a schematic diagrammatic view showing an example of a configuration wherein a pull-down resistor is inserted in the basic configuration shown in FIG. 1.

Therefore, in the present embodiment, such a configuration as shown in FIG. 2 is adopted to eliminate the problem described above. FIG. 2 shows only a circuit portion corresponding to wiring lines of one set of through-electrodes 111-1 and 111-2, extracted from the configuration shown in FIG. 1. In particular, FIG. 2 shows a through-electrode 111-1 of the chip 100-1 and a through-electrode 111-2 of the chip 100-2 connected to each other through the joining of the microbumps 112-1 and 112-2. Further, similarly as in FIG. 1, a driving transistor 121 is shown connected to the through-electrode 111-1, and a test transistor 122 is shown connected at the gate thereof to the through-electrode 111-2.

Further, in FIG. 2, a pull-down resistor Rpd is inserted between the gate of the test transistor 122 and the ground. By inserting the pull-down resistor Rpd in this manner, even if the connection between the through-electrodes 111-1 and 111-2 is placed into a failed state, the gate of the test transistor 122 is not placed into an open state, and the ground potential is set stably. Consequently, in a state in which the connection between the through-electrodes 111-1 and 111-2 is not good, an off state of the test transistor 122 is established with certainty, and a correct result of a connection test can be obtained.

Example of Incorporation of a Pull-Down Resistor

Figure 3:
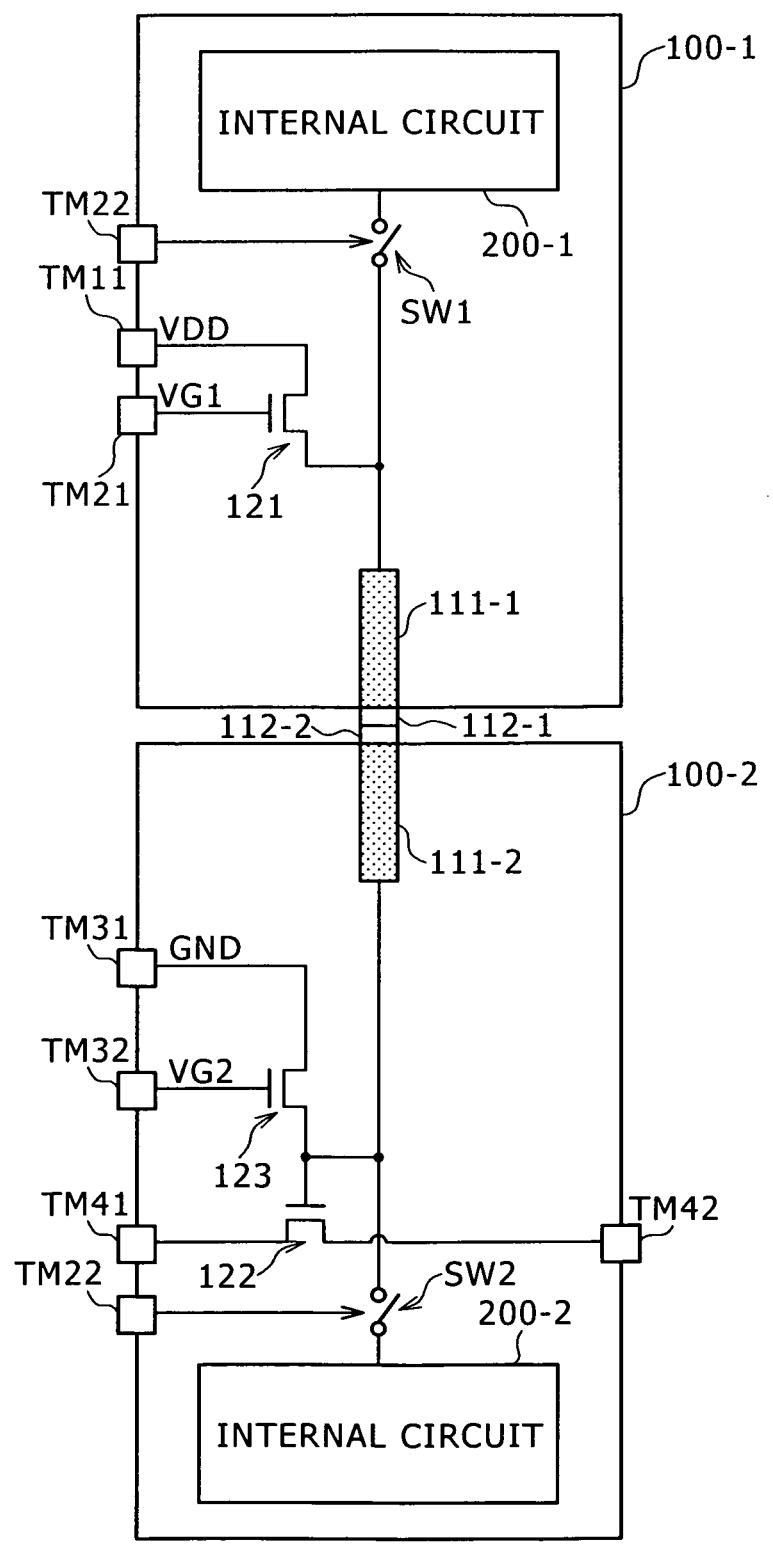
FIG. 3 is a schematic diagrammatic view showing an example of a circuit configuration wherein the chip shown in FIG. 1 is actually applied.

FIG. 3 shows an example of a circuit configuration in a case in which the pull-down resistor Rpd described hereinabove with reference to FIG. 2 is incorporated in an actual semiconductor chip. It is to be noted that, in FIG. 3, as an internal configuration of the chips 100-1 and 100-2, only a circuit portion corresponding to wiring lines of one set of the through-electrodes 111-1 and 111-2 is shown similarly as in FIG. 2.

Further, in FIG. 3, internal circuits 200-1 and 200-2 of the chips 100-1 and 100-2 are shown. The internal circuits 200-1 and 200-2 are components which execute operation corresponding to predetermined functions upon normal operation. Each of the internal circuits 200-1 and 200-2 is an example of an ordinary operation-ready circuit section in the disclosed technology.

In the chip 100-1, a switch SW1 is inserted in a signal path between the internal circuit 200-1 and the through-electrode 111-1. The switch SW1 carries out changeover between connection and disconnection of the internal circuit 200-1 and the through-electrode 111-1. Similarly, also in the chip 100-2, a switch SW2 for carrying out changeover between connection and disconnection between the internal circuit 200-2 and the through-electrode 111-2 is inserted.

The switch SW1 is controlled in accordance with a control signal inputted thereto from a terminal TM22 of the chip 100-1 such that it exhibits an off state upon testing but exhibits an on state upon normal operation. Similarly, also the switch SW2 is controlled in accordance with another control signal inputted thereto from the terminal TM22 of the chip 100-2 such that it exhibits an off state upon testing but exhibits an on state upon normal operation. Consequently, upon testing, the internal circuits 200-1 and 200-2 can be disconnected from the through-electrodes 111-1 and 111-2, respectively, so that no influence may be hand on the connection test. On the other hand, upon normal operation, the internal circuits 200-1 and 200-2 and the through-electrodes 111-1 and 111-2 are connected to each other through the wiring lines which connect them to each other, respectively.

Further, in the chip 100-1 shown in FIG. 3, the power supply voltage VDD is supplied to the drain of the driving transistor 121 from the outside through the terminal TM11. Further, the gate voltage VG1 is supplied to the gate of the driving transistor 121 from the outside through the terminal TM21.

A resistance transistor 123 is shown connected in the chip 100-2. The resistance transistor 123 corresponds to the pull-down resistor Rpd shown in FIG. 2. In this manner, the actual pull-down resistor Rpd can be formed from a transistor. The resistance transistor 123 is connected at the source thereof, for example, to a terminal TM31. The terminal TM31 in this instance is connected, for example, to an external signal line for the ground potential. In other words, the source of the resistance transistor 123 is always the ground potential. The resistance transistor 123 is connected at the drain thereof to the gate of the test transistor 122 and connected at the gate thereof to a terminal TM32.

Upon a connection test, the gate voltage VG2 is applied steadily to a terminal TM32 of the chip 100-2 to drive the resistance transistor 123 so that a fixed resistance value is exhibited between the source and the drain of the resistance transistor 123. Consequently, the gate of the test transistor 122 and the ground are placed into a state in which they are connected to each other through the resistor. In other words, an equivalent state in which the pull-down resistor Rpd is inserted between the gate of the test transistor 122 and the ground is established.

If the resistance transistor 123 is incorporated in such a manner as described above, then in the case where the connection between the through-electrodes 111-1 and 111-2 is not good, the gate potential of the test transistor 122 is fixed to the ground potential through the resistance transistor 123. Consequently, the test transistor 122 is driven so as to be placed into an off state with certainty, and the conduction state of the transistor series circuit can be tested correctly.

It is to be noted that the resistance transistor 123 is an example of a resistor and also an example of a second transistor in the disclosed technology.

2. Second Embodiment

Example of a Basic Configuration in which a Testing Circuit is Common to Different Chips In a stacked semiconductor apparatus, chips having a common structure are stacked occasionally. As an example, in a DRAM (Dynamic Random Access Memory), memory chips of the same structure manufactured by a common process are frequently stacked to form a stacked semiconductor apparatus.

In the foregoing description given with reference to FIGS. 1 to 3, the chip 100-1 and the chip 100-2 have different configurations from each other. In particular, the configuration which includes the driving transistors 121 for driving the through-electrodes 111 and the configuration which includes the test transistors 122 for driving the transistor series circuit are separate from each other.

Thus, a configuration wherein a circuit for a connection test is common to different chips is used in a second embodiment of the disclosed technology. An example of a configuration of a chip 100 according to the present second embodiment is described below with reference to FIG. 4. It is to be noted that, also in FIG. 4, circuits only corresponding to one set of through-electrodes 111-1 and 111-2 are shown for the convenience of illustration and description.

Figure 4:
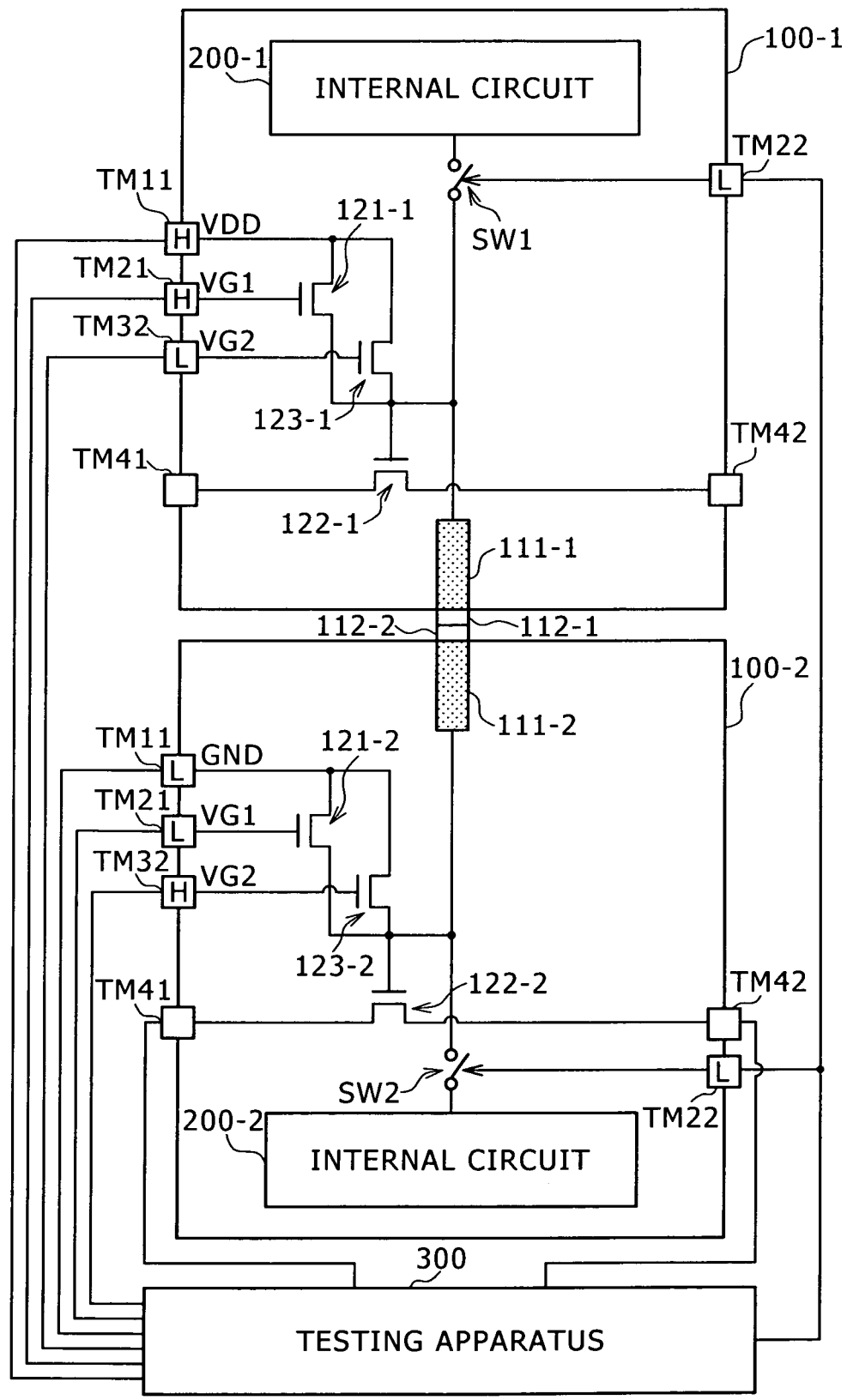
FIG. 4 is a schematic diagrammatic view showing an example of a basic configuration of a chip according to a second embodiment.

Further, in FIG. 4, a testing apparatus 300 is shown. The testing apparatus 300 shown is an apparatus for testing a connection state of the layers of the chip 100-1 and the chip 100-2. Operation of the testing apparatus 300 having the configuration shown in FIG. 4 is hereinafter described.

Here, a configuration of the chips 100 which include testing circuits having a common configuration is described taking the chip 100-2 as an example. The chip 100-2 shown in FIG. 4 includes a driving transistor 121-2 in addition to the configuration of the chip 100-2 shown in FIG. 3. In other words, as an element corresponding to the connection test, the chip 100-2 shown in FIG. 4 has a configuration of both of a set of a test transistor 122-2 and a resistance transistor 123-2 which form a transistor series circuit and the driving transistor 121-2 for driving a through-electrode 111.

In the chip 100-2, the driving transistor 121-2 is connected at the drain thereof to the terminal TM11. Further, the driving transistor 121-2 is connected at the source thereof to the through-electrode 111-2. In other words, in FIG. 4, the driving transistor 121-2 and the resistance transistor 123-2 are connected in parallel to each other.

It is to be noted that, in FIG. 4, the terminal TM31 shown in FIG. 3 is replaced by the terminal TM11. The terminal TM11 shown in FIG. 4 corresponds to both of the terminal TM11 and the terminal TM31 shown in FIG. 3, and a controlling voltage which changes over between the potential of the power supply voltage VDD and the ground potential is inputted to the terminal TM11 shown in FIG. 4. It is to be noted that the other terminals TM21, TM22, TM32, TM41 and TM42 are connected to the internal components of the chip 100-2 in a similar manner as in that in FIG. 3.

Also in the chip 100-1, a circuit for a connection test is configured in a similar manner as in the chip 100-2 described above. In this manner, the chip 100-1 and the chip 100-2 shown in FIG. 4 have a common configuration in regard to the circuits for a connection test.

Example of the Procedure of a Connection Test and Example of Operation in the Connection Test Now, a procedure of a connection test and an example of operation in the connection test by the configuration shown in FIG. 4 are described. The testing apparatus 300 in this instance are connected to the terminals TM11, TM21, TM22, TM32, TM41 and TM42 of the chip 100-2 as seen in FIG. 4. Further, the testing apparatus 300 is connected to the terminals TM11, TM21, TM22 and TM32 of the chip 100-1. As can be recognized from the following description, in a connection test in this instance, a driving transistor 121-1 is driven on the chip 100-1 side while conduction of the test transistor 122 is measured on the chip 100-2 side. Accordingly, there is no necessity to connect the testing apparatus 300 and the transistors on the chip 100-1 side. Therefore, the testing apparatus 300 is not connected to the terminals TM41 and TM42 on the chip 100-1 side.

In order to carry out a connection test, it is necessary to cut the signal path between the internal circuit 200-1 and the through-electrode 111-1 of the chip 100-1. Similarly, it is necessary to cut the signal path between the internal circuit 200-2 and the through-electrode 111-2 of the chip 100-2. Therefore, the testing apparatus 300 outputs a control signal of, for example, the "L" level to the terminals TM22 of the chip 100-1 and the chip 100-2. Consequently, upon connection testing, the switches SW1 and SW2 are switched off to establish a state in which the signal paths between the internal circuit 200 and the through-electrodes 111 in both of the chip 100-1 and the chip 100-2 are blocked.

It is to be noted that the on/off of the signal paths between the internal circuit 200 and the through-electrodes 111 may be carried out simultaneously for the chips 100 of a target of the connection test. Therefore, the terminals TM22 of the chip 100-1 and the chip 100-2 are connected commonly to the testing apparatus 300.

Under this condition, the testing apparatus 300 outputs the "H" level to the terminals TM11 and TM21 of the chip 100-1. It is to be noted that, in the case of FIG. 4, the voltage of the "H" level inputted to the terminal TM11 is used as the power supply voltage VDD.

In response to the input of the signal described above, in the chip 100-1, the gate voltage VG1 of the "H" level is applied to the driving transistor 121-1 to turn on the driving transistor 121-1, and consequently, the power supply voltage VDD applied from the terminal TM11 is applied to the through-electrode 111-1.

Further, the testing apparatus 300 outputs the "L" level to the terminal TM32. In particular, the gate voltage VG2 of the "L" level is applied to turn off a resistance transistor 123-1. In this state, it can be regarded that the resistance transistor 123-1 is omitted.

It is to be noted that, although the power supply voltage VDD is applied to the gate of a test transistor 122-1, since the terminals TM41 and TM42 connected to the opposite terminals of the test transistor 122 are in an open state, equivalently the test transistor 122 is omitted. In this manner, the chip 100-1 shown in FIG. 4 forms a circuit equivalent to the chip 100-1 shown in FIG. 3 to apply the power supply voltage VDD to the through-electrode 111-1.

Meanwhile, the testing apparatus 300 outputs the "L" level to the terminals TM11 and TM21 of the chip 100-2 and outputs a signal of the "H" level to the terminal TM32. It is to be noted that, in the case where a signal of the "L" level is outputted to the terminal TM11, the potential at the terminal TM11 is the ground (GND).

In this state, the gate voltage VG1 of the "L" level is applied to the driving transistor 121-2. The driving transistor 121-2 is placed into an off state in response to the gate voltage VG1. Meanwhile, since the gate voltage VG2 has the "H" level, the resistance transistor 123-2 is driven so as to have a predetermined resistance value. Meanwhile, the terminal TM11 has the ground potential. Therefore, the resistance transistor 123-2 functions as a pull-down resistor connected to the gate of the test transistor 122-2.

In this state, if the connection between the through-electrode 111-1 and the through-electrode 111-2 is good, then the power supply voltage VDD applied to the through-electrode 111-1 is transmitted to the through-electrode 111-2 and applied to the gate of the test transistor 122-2. Consequently, the test transistor 122-2 is placed into an on state to establish conduction between the terminal TM41 and the terminal TM42 of the chip 100-2.

On the other hand, in the case where the connection between the through-electrode 111-1 and the through-electrode 111-2 is not good, the power supply voltage VDD is not applied from the through-electrode 111-2 to the gate of the test transistor 122-2. Or, a potential corresponding to a high resistance state according to the state in which the connection is not good appears. In this instance, since the test transistor 122-2 is connected at the gate thereof to the ground potential through the resistance transistor 123-2 as a pull-down resistor, also the gate potential of the test transistor 122-2 is fixed to the ground potential. Consequently, in the state in which the connection between the through-electrode 111-1 and the through-electrode 111-2 is not good, the test transistor 122-2 maintains an off state stably.

Although the testing apparatus 300 of FIG. 4 tests conduction of the test transistor 122-2, when the connection of the through-electrode 111 is not good, the test transistor 122-2 is controlled to an off state stably as described above. Consequently, whether or not the connection of the through-electrode 111 is good can be decided correctly.

Further, in the configuration shown in FIG. 4, the driving transistor 121-2 is driven to apply the power supply voltage VDD to the through-electrode 111-2 on the chip 100-2 side. Meanwhile, it is possible to cause the chip 100-1 side to operate such that conduction of the test transistor 122-1 is tested. To this end, the testing apparatus 300 may output signals in the reverse pattern to that described hereinabove to the chip 100-1 and the chip 100-2. In particular, a signal of the "H" level is outputted to the terminals TM11 and TM21 of the chip 100-2, and a signal of the "L" level is outputted to the terminal TM32. Meanwhile, a signal of the "L" level is outputted to the terminals TM11 and TM21 of the chip 100-1, and a signal of the "H" level is outputted to the terminal TM32.

Example of a Configuration for Carrying Out a Connection Test of an Entire Group of a Plurality of Through-Electrodes FIG. 4 shows only the circuit portion corresponding to one set of through-electrodes 111-1 and 111-2 as a basic configuration wherein a common circuit for a connection test is used in the chips 100. However, an actual chip has a large number of through-holes. In the embodiment, whether or not a connection of an entire group of such through-electrodes is good is tested as described hereinabove with reference to FIG. 1.

Figure 5:
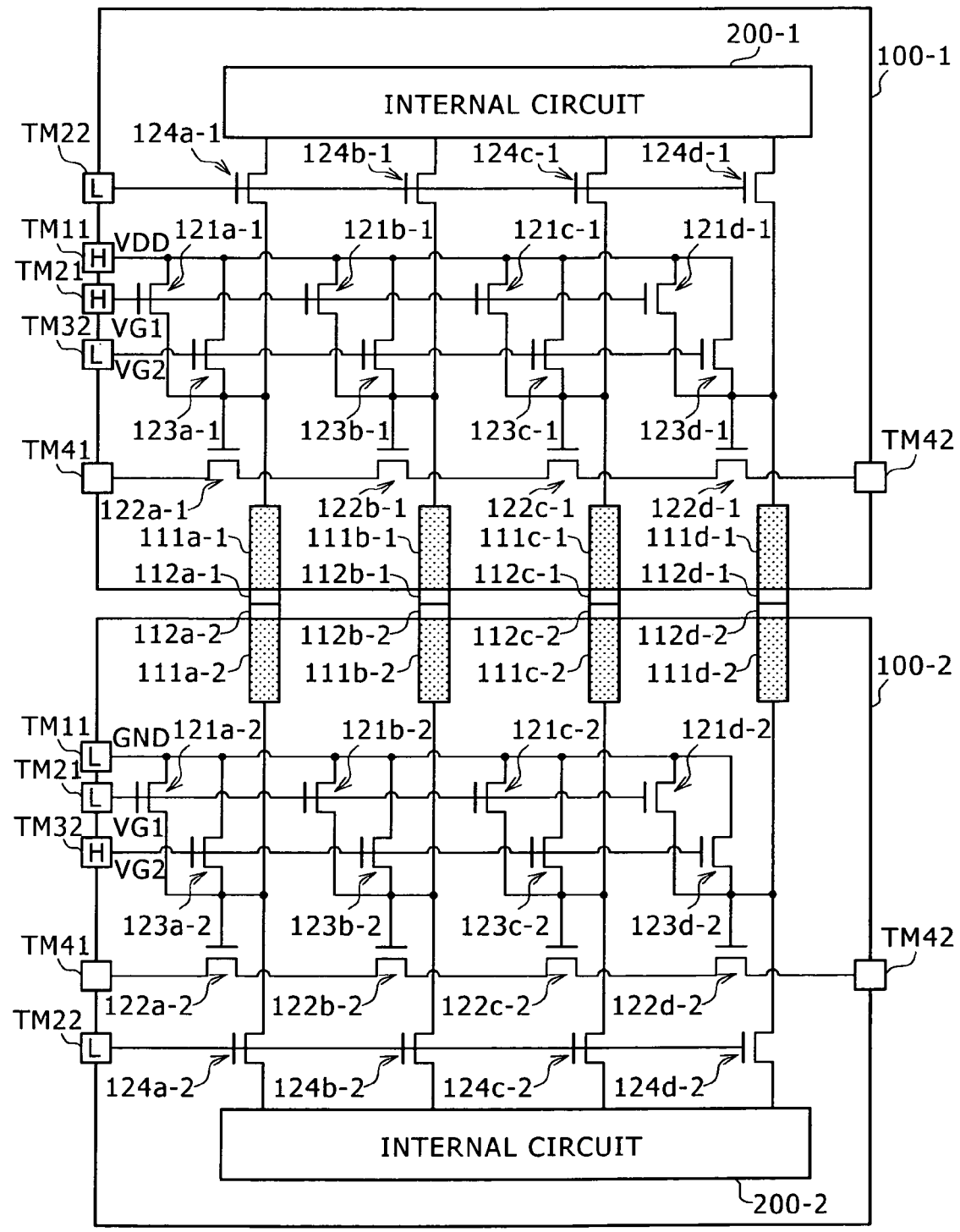
FIG. 5 is a schematic diagrammatic view showing an example of a circuit configuration wherein the chip shown in FIG. 4 is actually applied.

Thus, an example of a circuit configured based on the configuration shown in FIG. 4 for testing the connection of an entire group of a plurality of through-electrodes is shown in FIG. 5.

First, a circuit configuration of the chip 100-1 shown in FIG. 5 is described. Referring to FIG. 5, the chip 100-1 shown includes four through-electrodes 111a-1 to 111d-1. Further, corresponding to the through-electrode 111a-1, a circuit including a driving transistor 121a-1, a test transistor 122a-1 and a resistance transistor 123a-1 is connected in a circuit scheme similar to that shown in FIG. 4. Similarly, corresponding to the through-electrode 111b-1, a circuit including a driving transistor 121b-1, a test transistor 122b-1 and a resistance transistor 123b-1 is connected. Further, corresponding to the through-electrode 111c-1, a circuit including a driving transistor 121c-1, a test transistor 122c-1 and a resistance transistor 123c-1 is connected. Furthermore, corresponding to the through-electrode 111d-1, a driving transistor 121d-1, a test transistor 122d-1 and a resistance transistor 123d-1 is connected.

Further, to the terminal TM11 of the chip 100-1, the driving transistors 121a-1 to 121d-1 are connected commonly at the drain thereof and the resistance transistors 123a-1 to 123d-1 are connected commonly at the source thereof.

Meanwhile, to the terminal TM21 of the chip 100-1, the driving transistors 121a-1 to 121d-1 are connected commonly at the gate thereof. Further, to the terminal TM32 of the chip 100-1, the resistance transistors 123a-1 to 123d-1 are connected commonly at the gate thereof.

Further, the four test transistors 122a-1 to 122d-1 are successively connected in series to form a transistor series circuit as seen in FIG. 5. The transistor series circuit is connected at the opposite ends thereof to the terminals TM41 and TM42.

Further, in FIG. 5, a portion corresponding to the switch SW1 shown in FIG. 4 is shown as a mode changeover transistor 124-1. In this manner, in an actual semiconductor chip, the switches SW for switching on/off a signal path between the internal circuit 200 and the through-electrode 111 can be formed from a transistor. Also the mode changeover transistor 124-1 is provided corresponding to each through-electrode 111-1. The mode changeover transistor 124a-1 is inserted between the internal circuit 200-1 and the through-electrode 111a-1. Similarly, the mode changeover transistors 124b-1 to 124d-1 are inserted between the internal circuit 200-1 and the through-electrodes 111b-1 to 111d-1, respectively. Further, the mode changeover transistors 124a-1 to 124d-1 are connected commonly at the gate thereof to the terminal TM22. The mode changeover transistors 124 and the switches SW1 and SW2 shown in FIG. 4 and corresponding to the mode changeover transistors 124 are an example of mode changeover switches in the disclosed technology.

In the chip 100-2, the through-electrodes 111a-2 to 111d-2 are provided corresponding to the through-electrodes 111a-1 to 111d-1 of the chip 100-1, respectively. The through-electrodes 111a-1 to 111d-1 and the through-electrodes 111a-2 to 111d-2 are connected in individual groups to each other by joining of the microbumps 112-1 and 112-2 similarly as those shown in FIG. 1.

Further, in the chip 100-2, a circuit for a connection test is formed for each of the through-electrodes 111a-2 to 111d-2. It is to be noted that the connection scheme of the driving transistor 121-2, test transistor 122-2, resistance transistor 123-2 and mode changeover switch 124-2 for forming the circuit for a connection test is similar to that in the chip 100-1. Therefore, overlapping description of the connection scheme is omitted herein to avoid redundancy. Also the connection scheme between the transistors described above and the terminals TM11, TM21, TM32 and TM41 is similar to that in the chip 100-1, and therefore, overlapping description thereof is omitted herein to avoid redundancy. Further, in FIG. 5, the testing apparatus 300 shown FIG. 4 is not shown.

Example of a Procedure of a Connection Test and Example of Operation in the Connection Test Now, a procedure of a connection test and an example of operation based on the configuration described hereinabove with reference to FIG. 5 are described. It is to be noted that, also in the case of FIG. 5, it is assumed that the driving transistor 121-1 is driven on the chip 100-1 side to carry out a conduction test of a transistor series circuit on the chip 100-2 side.

Though not shown in FIG. 5, also the testing apparatus 300 in this instance is connected to the terminals TM11, TM21, TM22, TM32, TM41 and TM42 of the chip 100-2. Further, the testing apparatus 300 is connected to the terminals TM11, TM21, TM22 and TM32 of the chip 100-2.

Further, the testing apparatus 300 outputs a control signal of the "L" level to the terminals TM22 of the chip 100-1 and the chip 100-2 to turn off all of the mode changeover transistors 124 in the chip 100-1 and the chip 100-2. Consequently, signal paths between the internal circuit 200 and the through-electrodes 111 are blocked in the chip 100-1 and the chip 100-2.

Under this condition, the testing apparatus 300 outputs a signal of the "H" level to the terminals TM11 and TM21 of the chip 100-1. Consequently, the gate voltage VG1 of the "H" level is applied commonly to the driving transistors 121a-1 to 121d-1 of the chip 100-1 so that all of the driving transistors 121a-1 to 121d-1 are placed into an on state. In response to this, the power supply voltage VDD is applied simultaneously to the through-electrodes 111a-1 to 111d-1.

Further, the testing apparatus 300 outputs a signal of the "L" level to the terminal TM32. Consequently, the gate voltage VG2 of the "L" level is applied to the resistance transistors 123a-1 to 123d-1 to place the resistance transistors 123a-1 to 123d-1 into a non-conducting state. In this state, the resistance transistors 123a-1 to 123d-1 do not function as resistors, and equivalently they do not exist. In this manner, in the chip 100-1, the testing apparatus 300 operates such that the power supply voltage VDD is applied to the through-electrodes 111a-1 to 111d-1.

It is to be noted that, although the power supply voltage VDD is applied to the gate of the test transistors 122a-1 to 122d-1, equivalently the test transistors 122a-1 to 122d-1 are omitted similarly as in the case of FIG. 4.

Further, the testing apparatus 300 outputs a signal of the "L" level to the terminals TM11 and TM21 of the chip 100-2. Furthermore, the testing apparatus 300 outputs a signal of the "H" level to the terminal TM32.

In this state, the gate voltage VG1 of the "L" level is applied to the driving transistors 121a-2 to 121d-2. In response to the gate voltage VG1, the driving transistors 121a-2 to 121d-2 are all placed into an off state. On the other hand, since the gate voltage VG2 exhibits the "H" level, the resistance transistors 123a-2 to 123d-2 are placed into an on state and consequently function as pull-down resistors connected between the gate of the test transistor 122-2 and the terminal TM11 of the ground potential.

It is assumed that, in this instance, the connections between the sets of the through-electrodes 111a-1 to 111d-1 and the through-electrodes 111a-2 to 111d-2 are good. In this instance, the power supply voltage VDD applied to the through-electrodes 111a-1 to 111d-1 is transmitted to the through-electrodes 111a-2 to 111d-2 and applied to the gates of the test transistors 122a-2 to 122d-2, respectively. Consequently, all of the test transistors 122a-2 to 122d-2 are turned on and the transistor series circuit is rendered conducting.

In contrast, it is assumed that the connection of one or more of the sets of the through-electrodes 111a-1 to 111d-1 and the through-electrodes 111a-2 to 111d-2 is defective. In this instance, the power supply voltage VDD is not applied from the set of the through-electrodes 111-1 and 111-2 which are defective in connection to the gate of the test transistor 122-2. Consequently, the test transistor 122-2 of the group exhibits an off state, and the transistor series circuit exhibits a non-conducting state. It is to be noted that, also in this instance, the gate of the test transistor 122-2 corresponding to the through-electrodes 111-1 and 111-2 which are defective in connection is fixed to the ground potential so that the test transistor 122-2 exhibits an off state with certainty.

Also with the configuration shown in FIG. 5, the testing apparatus 300 can correctly carry out measurement in regard to whether the transistor series circuit connected between the terminals TM41 and TM42 in the chip 100-2 is conducting. In other words, the testing apparatus 300 can decide whether or not the connection is good in regard to, the entire group of the plural through-electrodes 111-1 and 111-2.

3. Third Embodiment

Example of a Configuration of the Stacked System Semiconductor Apparatus

The second embodiment described above is ready for a case in which chips stacked in a stacked semiconductor apparatus have a common structure. In contrast, chips having structures different from each other may sometimes be stacked to form a stacked semiconductor apparatus. For example, where it is tried to configure a stacked semiconductor apparatus wherein chips having different functions are stacked so as to be combined as one system, the chips are frequently different in structure such as an internal circuit configuration or electrode terminals. It is to be noted that a stacked semiconductor apparatus wherein chips different in structure from each other are stacked is hereinafter referred to also as stacked system semiconductor apparatus.

Figure 6:
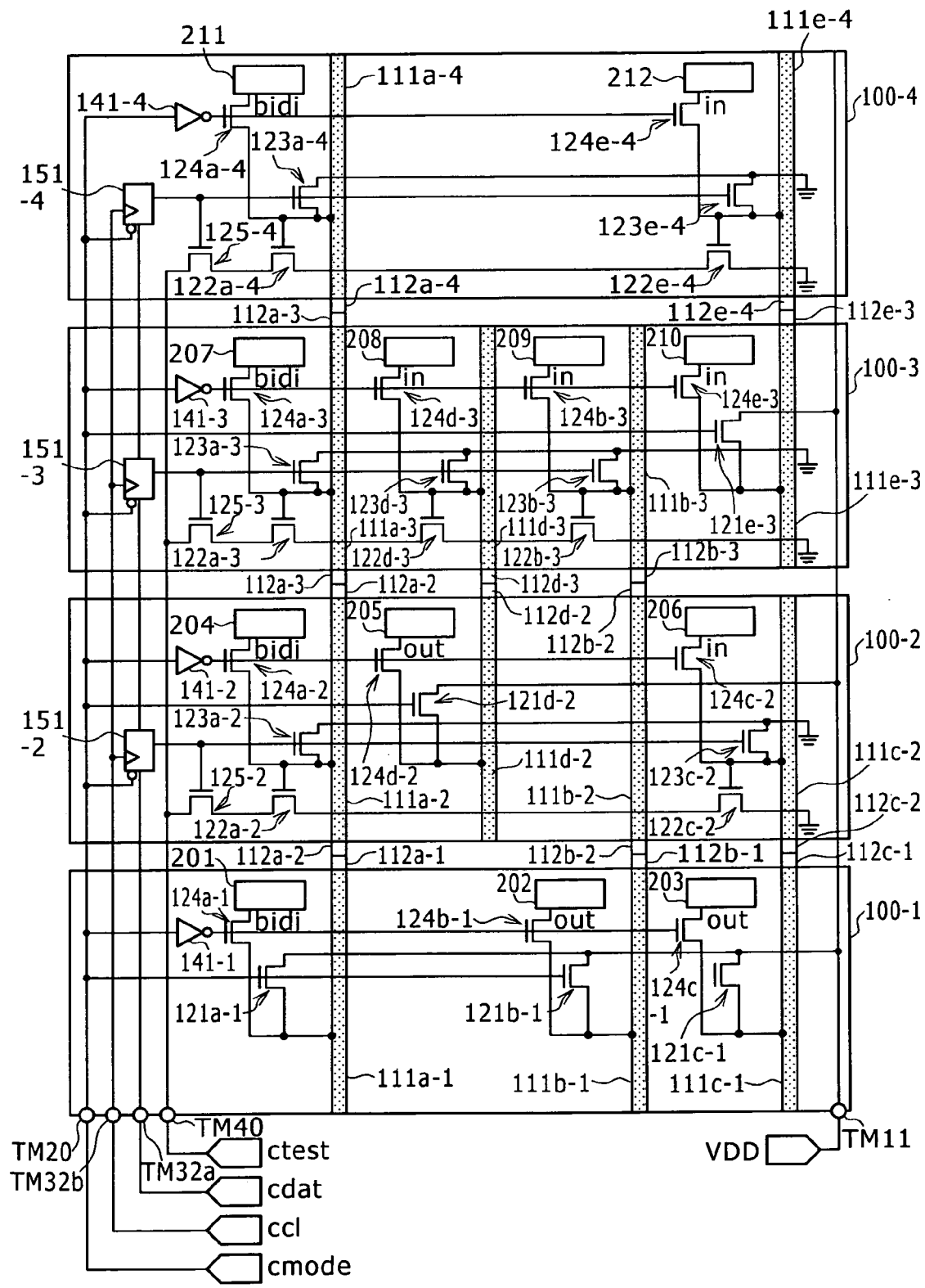
FIG. 6 is a schematic diagrammatic view showing an example of a circuit configuration wherein a chip according to a third embodiment is actually applied.

The third embodiment relates to an example of a circuit configuration of a chip 100 ready for the stacked system semiconductor apparatus described above and an example of operation of the chip 100 in a connection test. FIG. 6 shows an example of a configuration of a stacked system semiconductor apparatus corresponding to the third embodiment.

Referring to FIG. 6, the stacked system semiconductor apparatus shown is configured from four chips 100-1 to 100-4 stacked one on another. Further, in this instance, the chip 100-1 is disposed in the lowermost layer, and the chips 100-2, 100-3 and 100-4 are stacked in this order on the chip 100-1. It is to be noted that the chip 100-1 of the lowermost layer may be, for example, a circuit board called interposer. The chips 100-2 to 100-4 of the upper layers individually have predetermined functions different from each other.

First, the chip 100-1 of the lowermost layer includes terminals TM11, TM20, TM32a, TM32b and TM40 for being connected to the testing apparatus 300 side. It is to be noted that, in FIG. 6, the testing apparatus 300 is not shown.

The testing apparatus 300 supplies the power supply voltage VDD to the terminal TM11. The power supply voltage VDD inputted to the chip 100-1 through the terminal TM11 is successively inputted to the chips 100-2, 100-3 and 100-4 of the upper layers through the connections between the chip layers.

Further, the testing apparatus 300 outputs a test mode signal cmode to the terminal TM20. Also the test mode signal cmode inputted to the chip 100-1 through the terminal TM20 is successively inputted to the chips 100-2, 100-3 and 100-4 of the upper layers through the connections between the chip layers. It is to be noted that the test mode signal cmode inputted to the terminal TM20 corresponds, for example, in regard to correspondence to FIG. 5, to the signal inputted to the terminal TM21 for turning the mode changeover transistors 124 on and off. Further, the test mode signal cmode corresponds to the gate voltage VG1 of the driving transistor 121 inputted to the terminal TM21. In other words, in the configuration shown in FIG. 6, the on/off signal for the mode changeover transistors 124 and the gate voltage VG1 are used commonly.

Further, the testing apparatus 300 outputs chip selection data cdat to the terminal TM32a. The chip selection data cdat inputted to the chip 100-1 is inputted to the chip 100-2 through the interlayer connection. In the chip 100-2, the chip selection data cdat is inputted and outputted through a flip-flop 151-2 and inputted to the chip 100-3 of the upper layer further through the interlayer connection. Similarly, in the chip 100-3, the chip selection data cdat is inputted from the flip-flop 151-3 and outputted to the chip 100-4 of the upper layer through the interlayer connection. Also in the chip 100-4, the chip selection data cdat is inputted from the flip-flop 151-4. The flip-flops 151-2, 151-3 and 151-4 form a shift register of 3 bits.

The testing apparatus 300 outputs a clock ccl for the shifter register to a terminal TM32b. The clock ccl inputted to the chip 100-1 is successively inputted to the chips 100-2, 100-3 and 100-4 through the connection between the chip layers. In addition, the clock ccl is inputted to each clock input terminal of the flip-flops 151-2, 151-3 and 151-4. Further, the test mode signal cmode is inverted and then inputted to the reset terminal of the flip-flops 151-2 to 151-4. The flip-flops 151-2 to 151-4 in this instance reset the values held thereby till then in response to the reversal of the potential of the reset terminal from the "L" level to the "H" level.

It is to be noted that, as hereinafter described, outputs of the flip-flops 151-2, 151-3 and 151-4 function as control signals for operating the transistor series circuits in the individually same chips. Further, the outputs of the flip-flops 151-2, 151-3 and 151-4 are connected to the gate of the resistance transistors 123 of the corresponding chips. In particular, it can be considered that, to the terminal TM32 to which the gate voltage VG2 of the resistance transistor 123 shown in FIG. 5 is inputted, the terminals TM32a and TM32b for operating the shift register shown in FIG. 6 corresponds.

Further, to the terminal TM40, a measurement signal ctest outputted from the testing apparatus 300 for measuring conduction of a transistor series circuit is inputted. The measurement signal ctest inputted to the chip 100-1 is successively inputted to the chips 100-2, 100-3 and 100-4 through the connections between the chip layers. It is to be noted that, in the chips 100-2 to 100-4 shown in FIG. 6, each transistor series circuit is connected at one of the opposite ends thereof to the ground and at the other end thereof to a signal line corresponding to the terminal TM40. In this instance, the terminal TM40 corresponds, for example, to one of the terminal TM41 and the terminal TM42 shown in FIG. 5. For example, in the case where it is considered that the terminal TM40 corresponds to the terminal TM41, it is considered that the transistor series circuit is connected at one end thereof to a signal line for the ground in the inside of the chip in place of the terminal TM42 shown in FIG. 5. Accordingly, the testing apparatus 300 in this instance measures conduction between the terminal TM40 and the ground in a state in which the measurement signal ctest is outputted.

It is to be noted that the connection of signal lines corresponding to the terminals between chip layers can be formed by joining of microbumps. Further, wiring lines in each chip 100 for the terminals other than the terminal TM32a with regard to which a flip-flop 151 is interposed can be made through-electrodes.

It is to be noted that, in FIG. 6, only the through-electrodes 111 and the microbumps 112 corresponding to the circuits for a connection test are shown while the through-electrodes and the microbumps corresponding to the terminals are not shown for the convenience of simplified illustration.

Now, an internal configuration of the chip 100-1 is described. The chip 100-1 includes, as through-electrodes which make an object of a connection test, three through-electrodes 111a-1, 111b-1 and 111c-1. The through-electrodes 111a-1, 111b-1 and 111c-1 form part of signal paths corresponding to the internal circuits 201 to 203, respectively.

Further, as a circuit for carrying out a connection test for the through-electrode 111a-1, the chip 100-1 includes a driving transistor 121a-1 and a mode changeover transistor 124a-1. Further, for the through-electrode 111b-1, a driving transistor 121b-1 and a mode changeover transistor 124b-1 are provided. For the through-electrode 111c-1, a driving transistor 121c-1 and a mode changeover transistor 124c-1 are provided. The driving transistors 121a-1 to 121c-1 are connected at the source thereof to the driving electrodes 111a-1 to 111c-1, respectively. Further, the driving transistors 121a-1 to 121c-1 are connected at the drain thereof commonly to the power supply voltage VDD. Further, the driving transistors 121a-1 to 121c-1 are connected at the gate thereof to a signal line for the test mode signal cmode.

Further, the mode changeover transistor 124a-1 is inserted in the signal line between the internal circuit 201 and the through-electrode 111a-1. It is to be noted that this signal line provides a path along which a signal is inputted and outputted bidirectionally to and from the internal circuit 201.

The mode changeover transistor 124b-1 is inserted in the signal line between the internal circuit 202 and the through-electrode 111b-1. This signal line provides a path along which a signal is outputted from the internal circuit 202.

The mode changeover transistor 124c-1 is inserted in the signal line between the internal circuit 203 and the through-electrode 111c-1. This signal line provides a path along which a signal is outputted from the internal circuit 203.

The mode changeover transistors 124a-1 to 124c-1 are connected at the gate thereof to the test mode signal cmode through an inverter 141-1.

Now, a configuration of the chip 100-2 is described. The chip 100-2 includes, as through-electrodes which make an object of a connection test, four through-electrodes 111a-2 to 111d-2. The through-electrodes 111a-2 to 111c-2 provide wiring lines corresponding to internal circuits 204 to 206, respectively.

It is to be noted that the through-electrode 111b-2 is formed as a passage wiring line for connecting the through-electrode 111b-1 of the chip 100-1 and the through-electrode 111b-3 of the chip 100-3. Therefore, the through-electrode 111b-2 does not have a corresponding internal circuit. Further, in this connection, also a circuit for a connection test is not added. Further, a circuit for a connection test may be added to the through-electrode 111b-2. However, that only a circuit ready for a connection test is formed for a through-electrode to which a signal line corresponding to ordinary operation need not be connected may not be efficient from the point of view of a manufacturing process. Therefore, in this instance, a connection test circuit is not added to the through-electrode 111b-2.

For the through-electrode 111a-2, a test transistor 122a-2, a resistance transistor 123a-2 and mode changeover transistor 124a-2 are provided. Similarly, also for the through-electrode 111c-2, a test transistor 122c-2, a resistance transistor 123c-2 and a mode changeover transistor 124c-2 are provided.

The test transistor 122a-2 is connected at the gate thereof to the through-electrode 111a-2. The test transistor 122c-2 is connected at the gate thereof to the through-electrode 111c-2. The test transistors 122a-2 and 122c-2 are connected in series to form a transistor series circuit. This transistor series circuit is connected at one end portion thereof to the measurement signal ctest through a serial connection of a selection transistor 125-2 and at the other end portion thereof to the ground. The selection transistor 125-2 is connected at the gate thereof to an output terminal of the flip-flop 151-2.

The resistance transistor 123a-2 is connected at the drain thereof to the gate of the test transistor 122a-2. Meanwhile, the resistance transistor 123c-2 is connected at the drain thereof to the gate of the test transistor 122c-2. Further, the resistance transistors 123a-2 and 123c-2 are connected at the source thereof commonly to the ground. The resistance transistors 123a-2 and 123c-2 are connected at the gate thereof commonly to an output terminal of the flip-flop 151-2.

The through-electrode 111d-2 corresponds to the internal circuit 205 and includes a driving transistor 121d-2 and a mode changeover transistor 124d-2. The driving transistor 121d-2 is inserted between the signal line of the power supply voltage VDD and the through-electrode 111d-2 and is connected at the gate thereof to the signal line of the test mode signal cmode.

Meanwhile, the mode changeover transistor 124a-2 is inserted in the signal line between the internal circuit 204 and the through-electrode 111a-2. This signal line forms a path for a signal which is inputted and outputted bidirectionally to and from the internal circuit 204. The mode changeover transistor 124c-2 is inserted in the signal line between the internal circuit 206 and the through-electrode 111c-2. This signal line forms a path for a signal to be inputted to the internal circuit 206. The mode changeover transistor 124d-2 is inserted in the signal line between the internal circuit 205 and the through-electrode 111d-2. This signal line forms a path for a signal outputted from the internal circuit 205. The mode changeover transistors 124a-2, 124c-2 and 124d-2 are connected at the gate thereof to the test mode signal cmode through an inverter 141-2.

Now, a configuration of the chip 100-3 is described. The chip 100-3 includes, as through-electrodes which make an object of a connection test, four through-electrodes 111a-3, 111d-3, 111b-3 and 111e-3. The through-electrodes 111a-3, 111d-3, 111b-3 and 111e-3 correspond to internal circuits 207 to 210, respectively.

For the through-electrode 111a-3, a test transistor 122a-3, a resistance transistor 123a-3 and a mode changeover transistor 124a-3 are provided. Further, for the through-electrode 111b-3, a test transistor 122b-3, a resistance transistor 123b-3 and a mode changeover transistor 124b-3 are provided similarly. Further, for the through-electrode 111d-3, a test transistor 122d-3, a resistance transistor 123d-3 and a mode changeover transistor 124d-3 are provided.

For the through-electrode 111e-3, a driving transistor 121e-3 and a mode changeover transistor 124e-3 are provided.

The test transistors 122a-3, 122b-3 and 122d-3 are connected at the gate thereof to the through-electrodes 111a-3, 111b-3 and 111d-3, respectively. The test transistors 122a-3, 122b-3 and 122d-3 are connected in series to form a transistor series circuit. This transistor series circuit is connected at one end thereof to the signal line for the measurement signal ctest through the selection transistor 125-3 and at the other end thereof to the ground. The selection transistor 125-3 is connected at the gate thereof to an output terminal of the flip-flop 151-3.

Further, the resistance transistors 123a-3, 123b-3 and 123d-3 are inserted between the gate of the test transistors 122a-3, 122b-3 and 122d-3 and the ground, respectively. Further, the resistance transistors 123a-3, 123b-3 and 123d-3 are connected at the gate thereof commonly to an output terminal of the flip-flop 151-3.

Further, the driving transistor 121e-3 is inserted between the power supply voltage VDD and the through-electrode 111e-3 and is connected at the gate thereof to the signal line for the test mode signal cmode.

Further, the mode changeover transistor 124a-3 is inserted in the signal line between the internal circuit 207 and the through-electrode 111a-3. This signal line forms a path for a signal which is inputted and outputted bidirectionally to and from the internal circuit 207. Further, the mode changeover transistor 124d-3 is inserted in the signal line between the internal circuit 208 and the through-electrode 111d-3. This signal line forms a path for a signal which is inputted to the internal circuit 208. Further, the mode changeover transistor 124b-3 is inserted in the signal line between the internal circuit 209 and the through-electrode 111b-3. This signal line forms a path for a signal which is inputted to the internal circuit 209. The mode changeover transistor 124e-3 is inserted in the signal line between the internal circuit 210 and the through-electrode 111e-3. This signal line forms a path for a signal which is inputted to the internal circuit 210. The mode changeover transistors 124a-3, 124b-3, 124d-3 and 124e-3 are connected at the gate thereof to the test mode signal cmode through an inverter 141-3.

Now, a configuration of the chip 100-4 is described. The chip 100-4 includes, as through-electrodes which make an object of a connection test, two through-electrodes 111a-4 and 111e-4. The through-electrodes 111a-4 and 111e-4 correspond to internal circuits 211 and 212, respectively.

For the through-electrode 111a-4, a test transistor 122a-4, a resistance transistor 123a-4 and a mode changeover transistor 124a-4 are provided. Further, for the through-electrode 111e-4, a test transistor 122e-4, a resistance transistor 123e-4 and a mode changeover transistor 124e-4 are provided similarly.

The test transistors 122a-4 and 122e-4 are connected at the gate thereof to the through-electrodes 111a-4 and 111e-4, respectively. Further, the test transistors 122a-4 and 122e-4 are connected in series to form a transistor series circuit. This transistor series circuit is connected at one end thereof to the signal line for the measurement signal ctest through a selection transistor 125-4 and at the other end thereof to the ground. The selection transistor 125-4 is connected at the gate thereof to an output terminal of the flip-flop 151-4.

The resistance transistors 123a-4 and 123e-4 are inserted between the gate of the test transistors 122a-4 and 122e-4 and the ground, respectively. Further, the resistance transistors 123a-4 and 123e-4 are connected at the gate thereof commonly to the output terminal of the flip-flop 151-4.

Further, the mode changeover transistor 124a-4 is inserted in the signal line between the internal circuit 211 and the through-electrode 111a-4. This signal line forms a path for a signal which is inputted and outputted bidirectionally to and from the internal circuit 211. Further, the mode changeover transistor 124e-4 is inserted in the signal line between the internal circuit 212 and the through-electrode 111e-4. This signal line forms a path for a signal which is inputted to the internal circuit 212. The mode changeover transistors 124a-4 and 124e-4 are connected at the gate thereof to the test mode signal cmode through an inverter 141-4.

Further, the connections between the layers through the through-electrodes 111 in the chips 100-1 to 100-4 are such as described below. First, as shown in FIG. 6, the through-electrodes 111a-1 to 111a-4 of the chips 100-1 to 100-4 are connected such that they become one signal line through joining of the microbumps 112a thereof between the chip layers.

The through-electrodes 111b-1 to 111b-3 in the chips 100-1 to 100-3 are connected so as to make one signal line through joining of the microbumps 112b between the chip layers.

Between the chip 100-1 and the chip 100-2, the through-electrode 111c-1 and the through-electrode 111c-2 are connected so as to make one signal line through joining of the microbumps 112c-1 and 112c-2.

Between the chip 100-2 and the chip 100-3, the through-electrode 111d-2 and the through-electrode 111d-3 are connected so as to make one signal line through joining of the microbumps 112d-2 and 112d-3.

Further, between the chips 100-3 and 100-4, the through-electrodes 111e-3 and 111e-4 are connected so as to make one signal line through joining of the microbumps 112e-3 and 112e-4.

Example of a Procedure of a Connection Test and Example of Operation in the Connection Test Now, an example of a procedure of a connection test for the stacked system semiconductor apparatus described hereinabove with reference to FIG. 6 and an example of operation in the procedure are described. First, in the case of a structure wherein three or more chips 100-1 to 100-4 are stacked in this manner, basically a connection test between two chip layers is successively carried out. This signifies that not transistor series circuits formed in the chips 100-2 to 100-4 in FIG. 6 are rendered valid at the same time to carry out measurement but are successively rendered valid one by one to successively carry out measurement. Therefore, in the following description, a case in which the transistor series circuits are successively rendered valid in the order of the chips 100-2, 100-3 and 100-4 to carry out measurement is described as an example.

It is to be noted that the order of the chips 100 in which measurement of a transistor series circuit is carried out is not necessarily limited to the example described above. However, as can be recognized from the foregoing description, in regard to specification of a defective place, it is higher in efficiency to carry out a connection test in the order from a lower layer toward an upper layer.

First, upon a connection test, the testing apparatus 300 outputs the test mode signal cmode of the "H" level to the terminal TM20. Further, the testing apparatus 300 outputs the power supply voltage VDD to the terminal TM11. Furthermore, the testing apparatus 300 outputs a measurement signal ctest to the terminal TM40.

Consequently, a gate voltage of the "L" level is outputted from the inverter 141 to the gate of the mode changeover transistors 124 in the chips 100-1 to 100-4 first. In response to the gate voltage, all mode changeover transistors 124 of the chips 100-1 to 100-4 are turned off, and the internal circuits 201 to 212 are brought into a state in which the signal paths therefrom to the corresponding through-electrodes 111 are blocked.

Further, the driving transistors 121a-1 to 121c-1 of the chip 100-1 are turned on when the test mode signal cmode of the "H" level is applied to the gate of them. Consequently, the power supply voltage VDD is applied to the driving electrodes 111a-1 to 111c-1 to which the driving transistors 121a-1 to 121c-1 are connected, respectively.

Similarly, also the driving transistor 121d-2 of the chip 100-2 and the driving transistor 121e-3 of the chip 100-3 are turned on when the test mode signal cmode of the "H" level is applied to the gate of them. Consequently, in the chip 100-2, the power supply voltage VDD is applied to the through-electrode 111d-2 connected to the driving transistor 121d-2. Similarly, in the chip 100-3, the power supply voltage VDD is applied to the through-electrode 111e-3 connected to the driving transistor 121e-3.

Under the condition described above, the testing apparatus 300 first executes control for selecting the chip 100-1. To this end, the testing apparatus 300 outputs data of "0," "0" and "1" in this order as the chip selection data cdat and outputs the clock ccl for 3 cycles at corresponding timings. Consequently, the flip-flops 151-2, 151-3 and 151-4 which configure the shift register retain and output "0," "0" and "1," respectively. At this time, in the chip 100-2, the selection transistor 125-2 is turned on, and an end portion of the transistor series circuit is connected to the signal line for the measurement signal ctest. In other words, the transistor series circuit is validated for measurement by the testing apparatus 300. In the meantime, in each of the chips 100-3 and 100-4, the selection transistors 125-3 and 125-4 are turned off, and an end portion of the transistor series circuit is placed into a state in which it is disconnected from the signal line for the measurement signal ctest. In this manner, chip selection is carried out such that the transistor series circuit only of the chip 100-2 from among the chips 100-2 to 100-4 is validated. The testing apparatus 300 outputs the measurement signal ctest to measure conduction of the transistor series circuit in the chip 100-2.

At this time, it is assumed that the connection between the through-electrode 111a-1 and the through-electrode 111a-2 is good. In this instance, the power supply voltage VDD applied to the through-electrode 111a-1 from the driving transistor 121a-1 of the chip 100-1 turns on the test transistor 122a-2 through the through-electrode 111a-2. Similarly, it is assumed that the connection between the through-electrode 111c-1 and the through-electrode 111c-2 is good. In this instance, the test transistor 122c-2 is turned on by the power supply voltage VDD applied to the through-electrode 111c-1 from the driving transistor 121c-1. In this manner, if the connection between the through-electrode 111a-1 and the through-electrode 111a-2 and the connection between the through-electrode 111c-1 and the through-electrode 111c-2 are good, then a measurement result that the transistor series circuit in the chip 100-2 is conducting is obtained.

In contrast, it is assumed that at least one of the connection between the through-electrodes 111a-1 and 111a-2 and the connection between the through-electrodes 111c-1 and 111c-2 is not good. In this instance, a measurement result that the transistor series circuit in the chip 100-2 is not conducting is obtained.

In this manner, if the chip 100-2 is selected to carry out a connection test first, then it is decided whether or not the connection between the through-electrodes 111a-1 and 111a-2 and the connection between the through-electrodes 111c-1 and 111c-2 are good.

Then, the testing apparatus 300 changes over, for example, the test mode signal cmode to the "L" level once and then causes the test mode signal cmode to the "H" level again. Consequently, the values having been retained in the flip-flops 151-2 to 151-4 are reset. Then, the testing apparatus 300 outputs data of "0," "1" and "0" in this order as the chip selection data cdat together with the clock ccl. Consequently, the transistor series circuit only of the chip 100-3 is validated.

If, in this state, the connection between the through-electrodes 111a-2 and 111a-3 is good, then the test transistor 122a-3 of the chip 100-3 is turned on by the power supply voltage VDD applied from the driving transistor 121a-1 to the through-electrode 111a-1.

Meanwhile, if the connections between the through-electrodes 111b-1, 111b-2 and 111b-3 are good, then the test transistor 122b-3 of the chip 100-3 is turned on by the power supply voltage VDD applied from the driving transistor 121b-1 to the through-electrode 111b-1.

Further, if the connection between the through-electrodes 111d-2 and 111d-3 is good, then the test transistor 122d-3 of the chip 100-3 is turned on by the power supply voltage VDD applied from the driving transistor 121d-2 to the through-electrode 111d-2.

Accordingly, if a measurement result that the transistor series circuit in the chip 100-3 is conducting is obtained by the testing apparatus 300, then it can be determined that all of the connections of the next through-electrodes are good. In other words, all of the connection between the through-electrodes 111a-2 and 111a-3, the connection between the through-electrodes 111b-1, 111b-2 and 111b-3 and the connection between the through-electrodes 111d-2 and 111d-3 are good.

On the other hand, if another measurement result that the transistor series circuit in the chip 100-3 is not conducting is obtained, then this signifies that at least one of the three connections of the through-electrodes described hereinabove is defective.

When the transistor series circuit of the chip 100-1 was rendered valid to carry out the connection test, the decision regarding whether or not the connection between the through-electrodes 111b-1 and 111b-2 was good was not carried out as yet. However, whether or not the connection between the through-electrodes 111b-1 and 111b-2 is good can be decided by a connection test in which the transistor series circuit in the chip 100-3 is validated. In this manner, in the present embodiment, a decision regarding whether or not a connection is good can be carried out also in regard to a through-electrode such as a mere passing wiring line to which no signal line is connected, for example, in the inside of a chip.

Then, the testing apparatus 300 resets the flip-flops 151-2 to 151-4 again and outputs data of "1," "0" and "0" in this order as the chip selection data cdat together with the clock ccl as described hereinabove. Consequently, the transistor series circuit only in the chip 100-4 is placed into a validated state.

In this state, it is assumed that the connection between the through-electrodes 111a-3 and 111a-4 is good. In this instance, the power supply voltage VDD applied from the driving transistor 121a-1 to the through-electrode 111a-1 is transmitted to the through-electrode 111a-4 to turn on the test transistor 122a-4. Further, if the connection between the through-electrodes 111e-3 and 111e-4 is good, then the power supply voltage VDD applied to the through-electrode 111e-3 from the driving transistor 121e-3 is transmitted to the through-electrode 111e-4 to turn on the test transistor 122e-4.

Accordingly, in the case where a measurement result that the transistor series circuit in the chip 100-4 is conducting is obtained by the testing apparatus 300, the connection between the through-electrodes 111a-3 and 111a-4 described above is good. Further, the connection between the through-electrodes 111e-3 and 111e-4 is good. On the other hand, if another measurement result that the transistor series circuit in the chip 100-4 is not conducting is obtained, then it can be determined that at least one of the two connections between the through-electrodes described hereinabove is defective. In this manner, in the third embodiment, also in a stacked system semiconductor apparatus wherein chips 100 having different structures are stacked, whether or not a connection of through-electrodes between different chip layers is good can be decided precisely.

It is to be note that the procedure described above is applied to a stacked system semiconductor apparatus in a state in which all necessary chips 100 are stacked such that, while the chips 100 are successively selected, a connection test between the layers of the selected chips is carried out. However, a connection test may not be carried out in such a procedure as described above but may be carried out in another procedure wherein, for example, for each manufacturing stage where one chip 100 is stacked, a connection test is carried out between the chip in the uppermost layer and the chip in the underlying layer.

Further, in order to use the stacked system semiconductor apparatus shown in FIG. 6 in a normal mode, the terminals for exclusive use for a connection test such as the terminals TM20, TM32a, TM32b and TM40 are subject to a predetermined process such as, for example, a process for pulling down them to the ground so that normal operation may be carried out regularly.

4. Fourth Embodiment

Outline of the Fourth Embodiment

For example, in the embodiments described above, all of the test transistors 122 included in a transistor series circuit provided in one chip 100 are turned on at the same time. As described above, in an actual chip, a great number of through-electrodes exceeding 1,000 can be formed. Therefore, if one transistor series circuit is actually formed from all test transistors corresponding to such a great number of through-electrodes, then it is estimated that the transistor series circuit exhibits a considerably high on resistance. If the on resistance becomes higher than a fixed level, then there is the possibility that it may be difficult to obtain an accurate measurement result. Further, the total amount of current flowing to a resistance transistor 123, which corresponds to a pull-down resistor, and hence, pull-down current, may become excessively great, resulting in the possibility that it may have an influence on the internal circuit.

Therefore, the fourth embodiment adopts a configuration that a transistor series circuit is divided to decrease the number of those test transistors 122 which are to be driven into an on state at the same time thereby to eliminate the problem arising from the on resistance or the pull-down current described above.

Example of a Circuit Configuration

Figure 7:
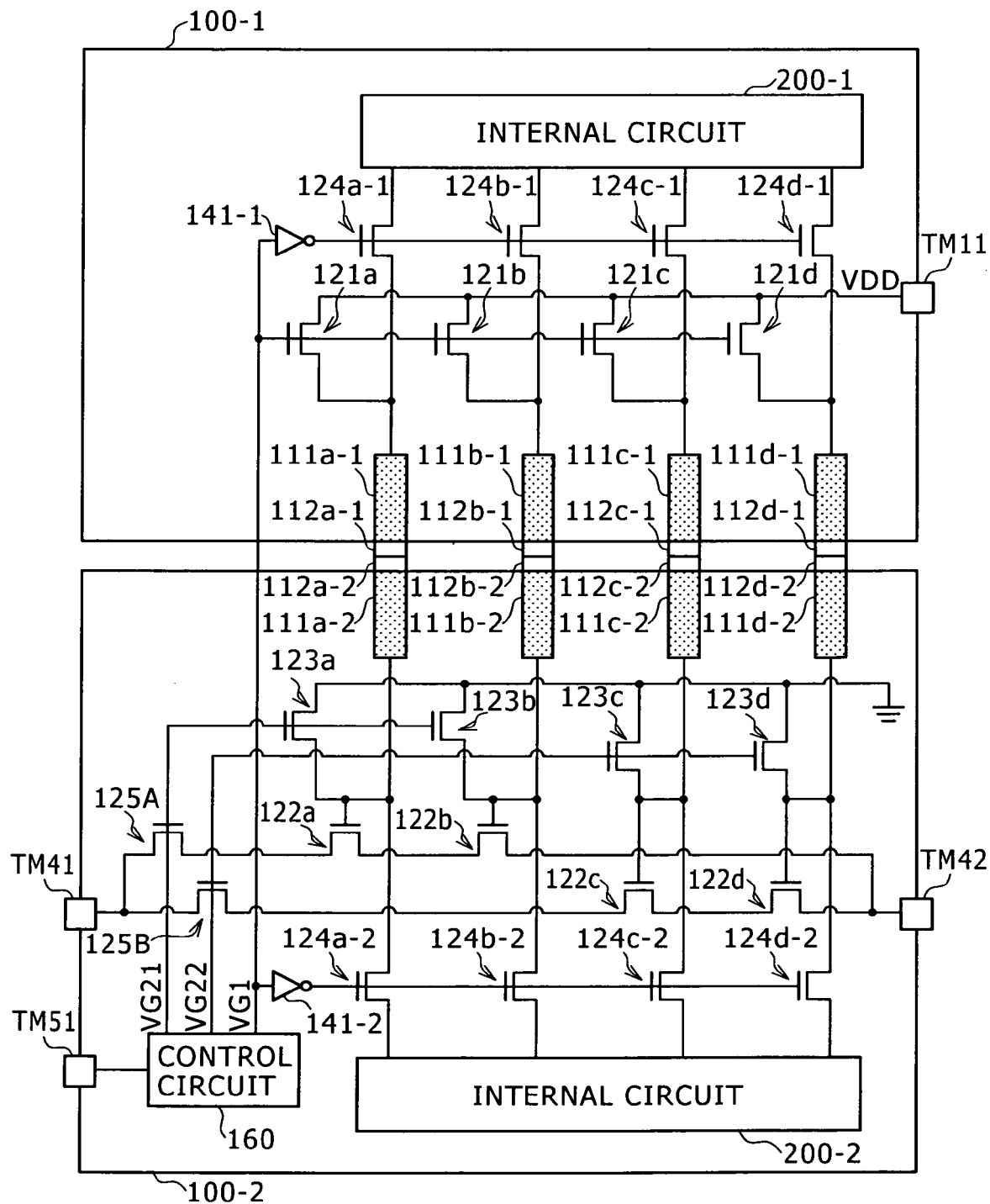
FIG. 7 is a schematic diagrammatic view showing an example of a circuit configuration wherein a chip according to a fourth embodiment is applied.

FIG. 7 shows an example of a circuit configuration of chips in the fourth embodiment. Referring to FIG. 7, a chip 100-1 has a circuit configuration equivalent, for example, to that of the chip 100-1 of FIG. 5 from which the test transistor 122-1 and the resistance transistor 123-1 are omitted. However, in the chip 100-1 shown in FIG. 7, the mode changeover transistors 124a-1 to 124d-1 are connected at the gate thereof to the signal line for the gate voltage VG1 through the inverter 141-1 similarly as in the configuration shown in FIG. 6.

Meanwhile, a chip 100-2 shown in FIG. 7 includes selection transistors 125A and 125B. Further, four test transistors 122a to 122d are grouped into a transistor series circuit of the test transistors 122a and 122b and another transistor series circuit of the test transistors 122c and 122d.

The transistor series circuit of the test transistors 122a and 122b is connected at one end thereof to a terminal TM41 through the selection transistor 125A and at the other end thereof to another terminal TM42. Similarly, the transistor series circuit of the test transistors 122c and 122d is connected at one end thereof to the terminal TM41 through the selection transistor 125B and at the other end thereof to the terminal TM42. In other words, in the configuration shown in FIG. 7, the four test transistors 122a to 122d are grouped or divided into two sets which do not overlap with each other. Thus, a transistor series circuit is formed for each of the two sets of the grouped test transistors, and the two transistor series circuits are connected in parallel. It is to be noted that a plurality of transistor series circuits formed by grouping in this manner are an example of divisional series circuits.

Further, in the configuration shown in FIG. 7, a control circuit 160 ready for a connection test is provided. This control circuit 160 drives the selection transistors 125A and 125B, resistance transistors 123 and mode changeover transistors 124-2 in accordance with an instruction inputted thereto from the testing apparatus 300, for example, through a terminal TM51.

The control circuit 160 outputs gate voltages VG21, VG22 and VG1. A signal line for the gate voltage VG21 is connected commonly to the gates of the selection transistor 125A and resistance transistors 123a and 123b. Meanwhile, the signal line for the gate voltage VG22 is connected commonly to the gates of the selection transistor 125B and resistance transistors 123c and 123d.

The signal line for the gate voltage VG1 is wired to extend between the layers of the chip 100-2 and the chip 100-1 and is connected commonly to the gates of the driving transistors 121a to 121d. Further, in the same chip 100-1, the signal line is connected commonly to the gates of the mode changeover transistors 124a-1 to 124d-1 through the inverter 141-1. Furthermore, the signal line for the gate voltage VG1 is connected commonly to the gates of the mode changeover transistors 124a-2 to 124d-2 through the inverter 141-2 in the chip 100-1.

Example of Operation Upon a Connection Test

An example of a procedure upon connection testing for the configuration described above with reference to FIG. 7 and an example of corresponding operation are described. First, upon connection testing, the control circuit 160 first outputs the gate voltage VG1 of the "H" level. Consequently, the internal circuit 200-1 in the chip 100 is disconnected from the through-electrodes 111a-1 to 111d-1. Similarly, the internal circuit 200-2 in the chip 100-2 is disconnected from the through-electrodes 111a-2 to 111d-2. Further, the driving transistors 121a to 121d in the chip 100-1 are placed into an on state so that the power supply voltage VDD inputted from the terminal TM11 is applied to the through-electrodes 111a-1 to 111d-1, respectively.

Under the condition described above, the control circuit 160 first outputs the gate voltage VG21 of the "H" level and outputs the gate voltage VG22 of the "L" level. Since the selection transistor 125A is placed into an on state and the selection transistor 125B is placed into an off state in response to the gate voltages VG21 and VG22, respectively, a state in which only the transistor series circuit of the test transistors 122a and 122b is connected between the terminals TM41 and TM42. Further, equivalently a state in which, although the resistance transistors 123a and 123b function as pull-down resistors, the resistors as the resistance transistors 123c and 123d are not connected is established.

Accordingly, in this state, measurement of conduction of the transistor series circuit including the test transistors 122a and 122b is carried out. In other words, whether or not the connection between the through-electrodes 111a-1 and 111a-2 and the connection between the through-electrodes 111b-1 and 111b-2 are good are decided.

Then, the control circuit 160 outputs the gate voltage VG21 of the "L" level and outputs the gate voltage VG22 of the "H" level. In response to the gate voltages, the selection transistor 125A is placed into an off state and the selection transistor 125B is placed into an on state. Therefore, between the terminals TM41 and TM42, a state in which only the transistor series circuit of the test transistors 122c and 122d is connected is established. Further, equivalently the resistors formed from the resistance transistors 123a and 123b are not connected while the pull-down resistors by the resistance transistors 123c and 123d are connected.

In the state described above, measurement of conduction of the transistor series circuit of the test transistors 122c and 122d is carried out. In particular, whether or not the connection between the through-electrodes 111c-1 and 111c-2 and the connection between the through-electrodes 111d-1 and 111d-2 are decided. This signifies that the connection test between all through-electrodes between the layers of the chips 100-1 and 100-2 is carried out.

By carrying out the connection test in this manner, the on resistance appearing in the transistor series circuit can be reduced in comparison with that in the case where a single transistor series circuit is formed from all test transistors 122-2. Further, the pull-down current amount to flow in one connection test can be reduced. Consequently, a stabilized measurement result is obtained. Further, the influence of the pull-down current upon the internal circuit of the chip can be reduced to such a degree that it can be ignored.

It is to be noted that the circuit configuration of FIG. 7 may be modified such that, for example, the gate voltages VG1, VG21 and VG22 are outputted not from the control circuit 160 but from the testing apparatus 300 through terminals. Further, in the fourth embodiment described above, the numbers of test transistors from which different divisional transistor series circuits are formed may not be equal to each other. Also the number of transistor series circuits to be formed by division or grouping is not limited particularly. Also it is possible to apply the configuration of the fourth embodiment which includes a plurality of transistor series circuits provided in parallel to such a configuration where the individual chips 100 have a common structure as described hereinabove.

Comparison Between the Embodiments and the Related Art

FIG. 8 illustrates a result of comparison between the embodiments and the related art. It is to be noted that, in FIG. 8, the embodiments are represented as transistor series connection method. Further, as the related art, a boundary scan method and a diode method are listed. In the diode method, a diode is connected to each through-electrode in a chip and an external terminal and a terminal for exclusive use for a conduction test are driven to selectively test conduction between through-terminals. Further, in this instance, it is assumed that the number of chips which form a stacked semiconductor apparatus is 10 and each chip has 1,000 through-electrodes.

First, the number of pin terminals necessary for a connection test is described. The number of pin terminals in the transistor series connection method in the embodiments is, for example, 4 in the maximum. The pin terminals in this instance correspond to the terminals TM20, TM32a, TM32b and TM40 shown in FIG. 6. It is to be noted that, since the terminal TM11 for the power supply voltage VDD is used also in normal operation, it is excluded from those pin terminals which are necessary for a connection test. Further, for example, in the case of a procedure wherein a connection test between the uppermost layer and the underlying layer is successively carried out every time a chip 100 is stacked as described hereinabove, control for chip selection is not required. Consequently, from among the terminals TM20, TM32a, TM32b and TM40 shown in FIG. 6, the terminals TM32a and TM32b corresponding to the data selection data cdat and the clock ccl can be omitted. In this instance, the number of pin terminals necessary for a connection test can be reduced to two.

Meanwhile, the number of pin terminals in the boundary scan method is four. The pin terminals are provided for inputting and outputting of a test signal and control of a boundary scan cell. In regard to the number of pin terminals, the embodiments of the disclosed technology and the boundary scan method are substantially equal.

Meanwhile, in the diode method, a number of terminals equal to the number of chips to be stacked and a number of terminals corresponding to a number of through-electrodes for each chip are required. Therefore, in the diode method, the number of pin terminals is 10,010. In this manner, according to the diode method, a very great number of pin terminals are required.

Now, the circuit amount is compared. First, if the unit of the circuit amount is regarded as a gate number, then the circuit amount in the transistor series connection method is, when roughly estimated, approximately 7 k gates in the entire stacked semiconductor apparatus.

In contrast, the circuit amount in the boundary scan method is approximately 100 k gates. In the boundary method, a boundary scan cell is provided for each through-electrode, and one boundary scan cell is formed, where it is formed using a NAND gate, from a comparatively great number of logic gates of 10 or more. One NAND gate is formed, for example, from four transistors. In contrast, in the embodiments of the disclosed technology, only it is necessary to provide several transistors for each through-electrode. In this manner, in the transistor series connection method of the present embodiments, the circuit amount is reduced by a great amount from that of the boundary scan method.

Meanwhile, the circuit amount according to the diode method is approximately 10 k diodes where the number of diodes is used as a unit. It is to be noted that, in the case where the circuit amount is regarded as a mounting area, it is substantially equal to that of the transistor series connection method according to the embodiments in which the circuit amount is, for example, approximately 7 k gates.

Now, the test time is compared. In the transistor series connection method according to the embodiments, if a cycle corresponding to one cycle of the clock is taken as a unit, then the test time is 9 cycles. In the embodiments, the time required for measurement of one transistor series circuit is one cycle for applying signals of a predetermined level at the same time to the terminals, for example, shown in FIGS. 3 to 6 and measuring conduction of a transistor series circuit in this state. Then, since this procedure is executed nine times in accordance with the fact that the chips of 10 layers are involved, the test time is totaling 9 cycles. However, in the case of such a configuration that a plurality of transistor series circuits are provided in parallel as in the fourth embodiment, the time for a multiplication corresponding to the number of transistor series circuits is required. In particular, in the case where two transistor series circuits are involved, then the test time is 18 cycles.

Further, in the boundary scan method, it is necessary to carry out a connection test between two layers at different cycle timings for different through-electrodes. Further, a cycle for inputting data for a test by shifting and a cycle for outputting data for a test by shifting are required. Furthermore, for example, it is necessary to input and output data of different values. Consequently, for example, the test time according to the boundary scan method is 40 k cycles and is considerably long.

Meanwhile, in the diode method, a conduction test of a diode for each through-electrode is carried out further for each of stacked chips. Consequently, the test time is 10 k cycles. In the case of the diode method, the test time is shorter than that in the boundary scan method. However, the test time according to the embodiments is further shorter.

Now, the readiness for a case where the array of through-electrodes is different for each layer of a chip. First, the transistor series connection method of the embodiments is easily made ready for a situation in which the structure such as an array of through-electrodes is different for each chip. This has been described hereinabove in connection with the third embodiment with reference to FIG. 6. Further, in this regard, also the boundary scan method is ready. On the other hand, since a circuit for the diode method is configured presupposing that the chips have a common structure, it is not ready for arrays of through-electrodes which are different among different chips. From these comparison results, the embodiments of the present disclosure achieve optimal performance comprehensively.

While preferred embodiments of the present disclosure have been described using specific terms, such description is for illustrative purpose only, and it is to be understood that changes and variations may be made without departing from the spirit or scope of the following claims.

The present disclosure contains subject matter related to that disclosed in Japanese Priority Patent Application JP 2010-165078 filed in the Japan Patent Office on Jul. 22, 2010, the entire content of which is hereby incorporated by reference.

What is claimed is:

1. A semiconductor device comprising:
a power supply voltage terminal electrically connected to a source of a first driving transistor and to a source of a second driving transistor;
a gate of a first test transistor electrically connected to a drain of the first driving transistor;
a gate of a second test transistor electrically connected to a drain of the second driving transistor;
a drain/source of the first test transistor electrically connected to a source/drain of the second test transistor;
a source/drain of a driving mode changeover transistor electrically connected to said drain of the first driving transistor; and
an input of a driving chip inverter electrically connected to a gate of the first driving transistor and to a gate of the second driving transistor.

2. The semiconductor device according to claim 1, further comprising:
a first resistor electrically connected between said gate of the first test transistor and ground.

3. The semiconductor device according to claim 2, further comprising:
a second resistor electrically connected between said gate of the second test transistor and said ground.

4. The semiconductor device according 1 claim further comprising: a drain of a resistance transistor electrically connected to said gate of the first test transistor.

5. The semiconductor device according to claim 4, further comprising: a gate of the resistance transistor electrically connected to a gate of a selection transistor.

6. The semiconductor device according to claim 5, further comprising:
a drain/source of the selection transistor electrically connected to a source/drain of the first test transistor.

7. The semiconductor device according to claim 1, further comprising: a source/drain of a test mode changeover transistor electrically connected to said drain of the first driving transistor.

8. The semiconductor device according to claim 7, further comprising:
a test chip internal circuit electrically connected to a drain/source of the test mode changeover transistor.

9. The semiconductor device according to claim 1, further comprising:
a driving chip internal circuit electrically connected to a drain/source of the driving mode changeover transistor.

10. The semiconductor device according to claim 1, further comprising:
a gate voltage terminal electrically connected to an input of the driving chip inverter.

11. The semiconductor device according to claim 1, further comprising:
a first driving chip through-electrode electrically connected to said drain of the first driving transistor and to a first driving chip microbump.

12. The semiconductor device according to claim 11, further comprising:
a first lest chip through-electrode electrically connected to said gate of the first test transistor and to a first test chip microbump.

13. The semiconductor device according to claim 12, wherein said first driving chip microbump is electrically connected to said first test chip microbump.

14. The semiconductor device according to claim 11, further comprising:
a second driving chip through-electrode electrically connected to said drain of the second driving transistor and to a second driving chip microbump.

15. The semiconductor device according to claim 14, further comprising:
a second test chip through-electrode electrically connected to said gate of the second test transistor and to a second test chip microbump.

16. The semiconductor device according to claim 15, wherein said second driving chip microbump is electrically connected to said second test chip microbump.

17. The semiconductor device according to claim 1, wherein said first driving transistor and said second driving transistor are on a driving semiconductor chip, said first test transistor and said second test transistor being on a test semiconductor chip.

* * * * *